(12) United States Patent
Funk et al.

(10) Patent No.: US 7,292,906 B2
(45) Date of Patent: Nov. 6, 2007

(54) FORMULA-BASED RUN-TO-RUN CONTROL

(75) Inventors: Merritt Funk, Austin, TX (US); Kevin Augustine Pinto, Austin, TX (US); Asao Yamashita, Wappingers Falls, NY (US); Wesley Natzle, New Paltz, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/890,410

(22) Filed: Jul. 14, 2004

(65) Prior Publication Data

US 2006/0015206 A1 Jan. 19, 2006

(51) Int. Cl.
*G06F 19/00* (2006.01)
*H01L 21/302* (2006.01)

(52) U.S. Cl. .................................. 700/121; 438/689

(58) Field of Classification Search ................ 700/121; 438/689

See application file for complete search history.

(56) References Cited

U.S. PATENT DOCUMENTS

| | | | |
|---|---|---|---|
| 5,926,690 A | 7/1999 | Toprac et al. | |
| 6,511,898 B1 | 1/2003 | Sonderman et al. | |
| 6,587,744 B1* | 7/2003 | Stoddard et al. | 700/121 |
| 6,665,575 B2* | 12/2003 | Betawar et al. | 700/121 |
| 6,665,623 B1 | 12/2003 | Pasadyn et al. | |
| 6,732,007 B1* | 5/2004 | Pasadyn et al. | 700/121 |
| 6,893,975 B1* | 5/2005 | Yue et al. | 438/714 |
| 2002/0192966 A1 | 12/2002 | Shanmugasundram et al. | |
| 2003/0014145 A1 | 1/2003 | Reiss et al. | |
| 2003/0230551 A1* | 12/2003 | Kagoshima et al. | 216/72 |
| 2004/0038139 A1* | 2/2004 | Mui et al. | 430/30 |
| 2004/0185583 A1* | 9/2004 | Tomoyasu et al. | 438/8 |
| 2004/0267399 A1* | 12/2004 | Funk | 700/121 |
| 2005/0218113 A1* | 10/2005 | Yue | 216/59 |
| 2005/0227494 A1* | 10/2005 | Higuchi et al. | 438/706 |

OTHER PUBLICATIONS

U.S. Appl. No. 10/705,200, filed Nov. 12, 2003, Hamelin.
U.S. Appl. No. 10/704,969, filed Nov. 12, 2003, Hamelin.
U.S. Appl. No. 10/705,397, filed Nov. 12, 2003, Wallace.

* cited by examiner

*Primary Examiner*—Ryan A. Jarrett

(57) ABSTRACT

A processing method of processing a substrate is presented that includes: receiving pre-process data, wherein the pre-process data comprises a desired process result and actual measured data for the substrate; determining a required process result, wherein the required process result comprises the difference between the desired process result and the actual measured data; creating a new process recipe by modifying a nominal recipe obtained from a processing tool using at least one of a static recipe and a formula model, wherein the new process recipe provides a new process result that is approximately equal to the required process result; and sending the new process recipe to the processing tool and the substrate.

27 Claims, 24 Drawing Sheets

| | | | unit | STEP1 | STEP2 | STEP3 | STEP4 | STEP5 | STEP6 |
|---|---|---|---|---|---|---|---|---|---|
| | Nominal Recipe | | | HV on | gas. stability | wafer temp. stability | React | NH3 purge | Vacuum |
| # | Time | | | 00:01.0 | stability | 00:30.0 | 02:00.0 | 00:05.0 | 01:00.0 |
| 1 | Pressure | | mT | 10 | 14 | 14 | 14 | 0 | 00:00.0 |
| 2 | N2 | gas1 | sccm | 0 | 0 | 0 | 0 | 0 | 0 |
| 3 | NH3 0.6-1 | gas2 | sccm | 0 | 7 | 7 | 7 | 7 | 0 |
| 4 | NH3 4.0-80 | gas3 | | 0 | 0 | 0 | 0 | 0 | 0 |
| 5 | HF 4.2-22. | gas4 | sccm | 0 | 0 | 0 | 14 | 0 | 0 |
| 6 | HF 20-101 | gas5 | | 0 | 0 | 0 | 0 | 0 | 0 |
| 7 | Ar 0.9-17.8 | gas6 | sccm | 0 | g6=x-43 | g6=x-43 | g6=x-43 | 0 | 0 |
| 8 | Ar 12-230d | gas7 | sccm | 200 | g6=43+15 | g6=43+15 | 0 | 200 | 0 |
| 9 | ESC | | kV | 2.0 | 2.0 | 2.0 | 2.0 | 2.0 | 2.0 |
| 10 | B.He Press. | | T | 10 | 10 | 10 | 10 | 0 | 0 |

FIG. 7

R2R Recipe Range Editor

Name: NAKA-PM1-RR    Module ID: PM01
Description:

| # | Control | Variable | Step | Lower Limit | Upper Limit | Unit | Description |
|---|---------|----------|------|-------------|-------------|------|-------------|
| 2 | Enabled | Chamber Pressure | Default | 0 | 1,000 | mTorr | Chamber Pressure |
| 3 | Enabled | Edge He Pressure | Default | 0 | 30 | Torr | Edge Helium Pressure |
| 4 | Enabled | Gas1 | Default | 20 | 500 | Sccm | org 0 10 500 |
| 5 | Enabled | Gas10 | Default | 0 | 500 | Sccm | |
| 6 | Enabled | Gas11 | Default | 0 | 500 | Sccm | |
| 7 | Enabled | Gas12 | Default | 0 | 500 | Sccm | |
| 8 | Enabled | Gas13 | Default | 0 | 500 | Sccm | |
| 9 | Enabled | Gas14 | Default | 0 | 500 | Sccm | |
| 10 | Enabled | Gas15 | Default | 0 | 500 | Sccm | |
| 11 | Enabled | Gas16 | Default | 0 | 500 | Sccm | |
| 12 | Enabled | Gas2 | Default | 0 | 500 | Sccm | |
| 13 | Enabled | Gas3 | Default | 0 | 500 | Sccm | |
| 14 | Enabled | Gas4 | Default | 0 | 500 | Sccm | |
| 15 | Enabled | Gas5 | Default | 0 | 500 | Sccm | |
| 16 | Enabled | Gas6 | Default | 0 | 500 | Sccm | |
| 17 | Enabled | Gas7 | Default | 0 | 500 | Sccm | |
| 18 | Enabled | Gas8 | Default | 0 | 500 | Sccm | |
| 19 | Enabled | Gas9 | Default | 0 | 500 | Sccm | |
| 20 | Enabled | Lower RF Power | Default | 0 | 1,500 | W | |
| 21 | Enabled | Step Process Time | Default | 0.1 | 1,199.9 | sec | |
| 22 | Enabled | Upper RF Power | Default | 0 | 1,500 | W | Step processing time |

End Point Recipe Range Set

| # | Control | Variable | Step | Lower Limit | Upper Limit | Unit | Description |
|---|---------|----------|------|-------------|-------------|------|-------------|
| 1 | Enabled | 1st Step | Default | ... | ... | | |
| 2 | Enabled | AGC Level Sensor1 | Default | 10 | 90 | % | |
| 3 | Enabled | AGC Level Sensor2 | Default | 10 | 90 | % | |
| 4 | Enabled | AGC Time | Default | 0 | 60 | sec | |
| 5 | Enabled | Average Time | Default | 5 | 120 | sec | |
| 6 | Enabled | Delay Time | Default | 0 | 180 | sec | |
| 7 | Enabled | Delay Point | Default | 0 | 999 | % | |
| 8 | Enabled | Detect Position | Default | ... | ... | | |
| 9 | Enabled | Detect type | Default | ... | ... | | |
| 10 | Enabled | Diff Time | Default | 0 | 9 | sec | |
| 11 | Enabled | END pt | Default | 0 | 99 | [XI%] | |
| 12 | Enabled | START pt | Default | 0 | 99 | [XI%] | |
| 13 | Enabled | Smoothing | Default | 0 | 20 | sec | |
| 14 | Enabled | Stable END | Default | 1 | 50 | | |
| 15 | Enabled | Stable START | Default | 1 | 50 | | |
| 16 | Enabled | Wave Length | Default | 200 | 800 | nm | |

Save   Cancel   Help

FIG. 8

| Control Strategy Editor | | | | | | ☒ |
|---|---|---|---|---|---|---|
| Strategy Name: | NAKA-R2R-TYPE1 | | Mode: | Standard | ▼ | ☑ Enabled |
| Description: | | | | | | |
| Load Port: | LPC | ▼ Update... | System Recipe: | NAKA/NAOKA-TYPE1 | ▼ | Update... |
| Transfer Route: | IMM1-PM01-IMM1-PM02-LLM2-IMM1 | | | | | Update... |
| Metrology Data Failure: | Use tool process recipe (Normal Recipe) | ▼ | Control Failure: | Use tool process recipe (Normal Recipe) | | ▼ |

Usage Context Specification

| Lot ID(s): | | Wafer ID(s): | |
|---|---|---|---|
| CJ ID(s): | | PJ ID(s): | |
| Cassette ID(s): | | Carrier ID(s): | |
| Slot ID(s): | | Substrate ID(s): | |
| Wafer Type: | | Scribed Wafer ID(s): | |
| | YYYY-MM-DD (HH-MM[:SS]) | | YYYY-MM-DD (HH-MM[:SS]) |
| Start Time later than: | | Start Time earlier than: | |

| Control Plans (FF) | Feedback Plans (FB) | | | | |
|---|---|---|---|---|---|
| Route Sequence | Target Module | Plan Sequence | Plan Name | Procerss Recipe2 | |
| 2 | PM01 | 1 | CTRL-PLAN-A | A-IEM-POLY/P1/NAKA/NAKA-P... | ▲ |
| 2 | PM01 | 2 | CTRL-PLAN-B | A-IEM-POLY/P1/NAKA/NAKA-P... | |
| 2 | PM01 | 3 | CTRL-PLAN-C | A-IEM-POLY/P1/NAKA/NAKA-P... | ▼ |

Save    Cancel    Help

FIG. 9

| R2R Control Plan Editor | | | | | | ☒ |
|---|---|---|---|---|---|---|
| Plan Name: | COR-FF | | Module: PM02 | | Recipe: | COR/P2/COR-FF |
| Description: | COR FF using 245 Trim Curve #3 | | ☐ Send alarm on FB plan update | | Updated: | 2003-12-18 15:38:41 |

Data Sources:

| Symbol | Type | Description | Parameter Value | |
|---|---|---|---|---|
| d1 | TeliusODP | CD3 245 Bottom CD | CD3 / Step=1 / SysRcpSeq=1 / FilterType=None | ▲ |
| o1 | Desired Output | Final CD Target after SE... | 45.0 | |
| o2 | Desired Output | SEHM Offset | 6.2 | ▼ |

Target Calculation, t=f(d,o,f)

| tx | | f(dx, ox, fx) |
|---|---|---|
| t1 | = | (0.86*d1+18.99)-o1-o2 |

Model Selections

| σ | Model Type | Model Name | Target | Lower Limit | Upper Limit | Static recipe Output (Y) |
|---|---|---|---|---|---|---|
| 1 | Formula Model | Trim6_1 to 6_7 | t1 | 6.1 | 6.7 | |
| 2 | Formula Model | Trim6_7 to 7_2 | t1 | 6.7 | 7.2 | |
| 3 | Formula Model | Trim7_2 to 7_7 | t1 | 7.2 | 7.7 | |
| 4 | Formula Model | Trim7_7 to 8_1 | t1 | 7.7 | 8.1 | |
| 5 | Formula Model | Trim8_1 to 8_5 | t1 | 8.1 | 8.5 | |
| 6 | Formula Model | Trim8_5 to 9 | t1 | 8.5 | 9.0 | |
| 7 | Formula Model | Trim9 to 9_6 | t1 | 9.0 | 9.6 | |
| 8 | Formula Model | Trim9_6 to 10_4 | t1 | 9.6 | 10.4 | |
| 9 | Formula Model | Trim10_4 to 11_5 | t1 | 10.4 | 11.5 | |
| 10 | Formula Model | Trim11_5 to 13_2 | t1 | 11.5 | 13.2 | |

Predicted result Calculation (Used in feedback plan)

p1= y

Predicted Etch calculation: Define the calculation in terms of y and d(1-9) defined in data Sources. Suggested: p1=d1-y

[ Save ]  [ Cancel ]  [ Help ]

FIG. 10

R2R Formula Model Editor

Name: Trim6_1 to 6_7    Recipe Range: COR    [Edit Range...]

Description: COR Trim (14mT)

Pre-Model Adjustment = f(t)

y = 11

Valid y after adjustment: 6.1    sys: 6.7

Model Equation y = f(x)

y = -0.0000004376*x^3 + 0.0003094108*X^2 - 0.809247809*x + 10.5046127664

Valid equation solution x: 60.0 ≤ x ≤ 71.0

Post-Model adjustment f(x)

| # | Parameter | Lower | Upper | Description | Step1 | Step2 | Step 3 | |
|---|---|---|---|---|---|---|---|---|
| 1 | Chamber Pressure | 10.0 | 14.0 | | | | | |
| 2 | Gas1 | 40.0 | 1000.0 | | | | | |
| 3 | Gas2 | 0.5 | 12.4 | | <New Term> | | | |
| 4 | Gas3 | 3.3 | 80.7 | | g7=53 | | | |
| 5 | Gas4 | 3.8 | 20.4 | | g6=x-53 | | | |
| 6 | Gas5 | 18.7 | 100.8 | | g1=80*x/100 | g6=x-5.3 | g6=x-5.3 | g6=x- |
| 7 | Gas6 | 6.0 | 17.7 | | g2=g1 + g7 | g6=x-5.3 | g1=80*x/100 | g7=5 |
| 8 | Gas7 | 20.0 | 110.0 | | | | | |
| 9 | He Pressure | 0.0 | 30.0 | Helium Pressure | | | | |
| 10 | StepProcessTime | 0.1 | 1000.0 | Step processing time | | | | |

[Save]  [Cancel]  [Help]

FIG. 13

| R2R Static Recipe Editor | | | | | | | | | |
|---|---|---|---|---|---|---|---|---|---|
| Name: SRA_no_HF | | | Recipe Range: RRafterInstall1 | | | | | | Edit Range... |
| Module ID: PM01 | | | Description: Static REcipe A noHF noNH3 for COR 2<y<6 | | | | | | |
| # | Variable | Lower | Upper | Description | Step 1 | Step 2 | Step 3 | Step 4 | Step 5 | Step 6 |
| 1 | Chamber Pressure | 0.0 | 1000.0 | Chamber Pressure | | 14.0 | 14.0 | 14.0 | | |
| 2 | Gas1 | 39.2999... | 500.0 | N2 | 200.0 | 50.0 | 50.0 | 50.0 | | |
| 3 | Gas2 | 0.5 | 12.3999... | NH3 | | | | | | |
| 4 | Gas3 | 3.20000... | 60.8000... | NH3 | | | | | | |
| 5 | Gas4 | 3.70000... | 20.7999... | HF | | | | | | |
| 6 | Gas5 | 18.1000... | 102.300... | HF | | | | | | |
| 7 | Gas6 | 0.69999... | 17.7999... | Ar | | | | | | |
| 8 | Gas7 | 10.0 | 230.0 | Ar | | | | | | |
| 9 | StepProcessTime | 0.1000... | 1000.0 | Step processing time | | | | | | |

Save   Cancel   Help

FIG. 16

| # | Nominal Recipe | | unit | STEP1 HV on | STEP2 gas. stability | STEP3 wafer temp. stability | STEP4 React | STEP5 NH3 purge | STEP6 Vacuum |
|---|---|---|---|---|---|---|---|---|---|
|   | Time |   |   | 00:01.0 | stability | 00:30.0 | 02:00.0 | 00:05.0 | 01:00.0 |
| 1 | Pressure |   | mT | 10 | 14 | 14 | 14 | 0 | 00:00.0 |
| 2 | N2 | gas1 | sccm | 0 | 0 | 0 | 0 | 0 | 0 |
| 3 | NH3 0.6-12 | gas2 | sccm | 0 | 7 | 7 | 7 | 7 | 0 |
| 4 | NH3 4.0-80 | gas3 |   | 0 | 0 | 0 | 0 | 0 | 0 |
| 5 | HF 4.2-22. | gas4 | sccm | 0 | 0 | 0 | 14 | 0 | 0 |
| 6 | HF 20-101 | gas5 |   | 0 | 0 | 0 | 0 | 0 | 0 |
| 7 | Ar 0.9-17.8 | gas6 | sccm | 0 | g6=x-43 | g6=x-43 | g6=x-43 | 0 | 0 |
| 8 | Ar 12-230d | gas7 | sccm | 200 | g6=43+15 | g6=43+15 | 0 | 200 | 0 |
| 9 | ESC |   | kV | 2.0 | 2.0 | 2.0 | 2.0 | 2.0 | 2.0 |
| 10 | B.He Press. |   | T | 10 | 10 | 10 | 10 | 0 | 0 |

FIG. 17

R2R Formula Model Editor

Name: COR1   Recipe Range: R2R_test_COR   Edit Range...

Description:

Pre-Model Adjustment y=f(t)
y= t1

Valid y after adjustment: $2.0 \leq y \leq 6.0$

Model Equation y = f(x)
y= $-0.0000004376 \cdot x^3 + 0.003094108 \cdot x^2 - 0.089247809 \cdot x + 10.5046127664$ Valid equation solution x: $60.0 \leq y \leq 70.0$

Post-Model Adjustment f(x)

| # | Parameter | Lower | Upper | Description | Step 1 | Step 2 | Step 3 | |
|---|---|---|---|---|---|---|---|---|
| 1 | Chamber Pressure | 0.0 | 1000.0 | Chamber Pressure | g8=10 | g8=10 | g8=10 | g8=1 |
| 2 | Gas1 | 39.3 | 1000.0 | N2 | | | | |
| 3 | Gas2 | 0.5 | 12.4 | NH3 | | | | |
| 4 | Gas3 | 3.2 | 80.8 | NH3 | g7=15 | g7=15 | | |
| 5 | Gas4 | 3.7 | 20.8 | HF | | | | |
| 6 | Gas5 | 18.1 | 102.3 | HF | g9=5+15 | g5=x-53 | g5=x-53 | g5=x |
| 7 | Gas6 | 0.7 | 17.8 | Ar | | g6=53+15 | g6=53+15 | g6=5 |
| 8 | Gas7 | 9.1 | 230.8 | Ar | | | | |
| 9 | He Pressure | 0.0 | 30.0 | Helium Pressure | | | | |
| 10 | StepProcessTime | 0.1 | 1000.0 | Step processing time | | | | |

Save   Cancel   Help

| # | Parameter | Lower | Upper | Description | Step 1 | Step 2 | Step 3 |
|---|---|---|---|---|---|---|---|
| 1 | 1st Step | 0.0 | 0.2 | | | | |
| 2 | AGC Level Sensor1 | 10.0 | 90.0 | | | | |
| 3 | AGC Level Sensor2 | 10.0 | 90.0 | | | | |
| 4 | AGC Time | 0.0 | 60.0 | | | | |
| 5 | Average time | 0.0 | 120.0 | | | | |
| 6 | Cent He Pressure | 0.0 | 30.0 | Cent He Pressure | | | |
| 7 | ChamberPressure | 0.0 | 1000.0 | Chamber Pressure | | | |
| 8 | Delay time | 0.0 | 180.0 | | | | |
| 9 | Detect Point | 0.0 | 999.9 | | | | |
| 10 | Detect Position | 0.0 | 0.1 | | | | |
| 11 | Detect type | 0.0 | 1.1 | | | | |
| 12 | Diff Time | 0.1 | 9.9 | | | | |
| 13 | END pt. | 0.0 | 999.999 | | | | |
| 14 | Edge He Pressure | 0.0 | 30.0 | Edge He Pressure | | | |
| 15 | Gas1 | 0.8 | 500.0 | | g6=80-g8 | g6=80-g8 | g6=80-g8 |
| 16 | Gas10 | 0.0 | 500.0 | | | | |
| 17 | Gas11 | 0.0 | 500.0 | | | | |
| 18 | Gas12 | 0.0 | 500.0 | | | | |
| 19 | Gas13 | 0.0 | 500.0 | | | | |
| 20 | Gas14 | 0.0 | 500.0 | | | | |
| 21 | Gas15 | 0.0 | 500.0 | | | | |
| 22 | Gas16 | 0.0 | 500.0 | | | | |
| 23 | Gas2 | 0.0 | 500.0 | | | | |
| 24 | Gas3 | 0.0 | 500.0 | | | | |
| 25 | Gas4 | 0.0 | 500.0 | | | | |
| 26 | Gas5 | 0.0 | 500.0 | | | | |
| 27 | Gas6 | 63.0 | 70.0 | | | | |
| 28 | Gas7 | 0.0 | 500.0 | | | | |
| 29 | Gas8 | 10.0 | 17.0 | | g8=80*x | g8=80*x | g8=80*x |
| 30 | Gas9 | 0.0 | 500.0 | | | | |
| 31 | Lower Rf Power | 0.0 | 1500.0 | | | g2=900 | g3=0 |
| 32 | START pt. | 0.0 | 99.999 | | | | |
| 33 | Smoothing | 0.1 | 20.0 | | | | |
| 34 | Stable END | 1.0 | 50.0 | | | | |
| 35 | Stable Start | 1.0 | 50.0 | | | | |
| 36 | StepProcessTime | 0.1 | 1199.9 | Step processing time | | | |
| 37 | Uppoer RF Power | 0.0 | 1500.0 | | | | |

FIG. 21

| R2R Control Plan Editor | | | | | | ☒ |
|---|---|---|---|---|---|---|
| Plan Name: | CTRL-PLAN-A | | Module: | PM01 | Recipe: | A-IEM-POLY/P1/NAKA/NAKA-POLY |
| Description: | | | ☐ Send alarm on FB plan update | | Updated: | 2004-03-05 17:01:25 |

Data Sources

| Symbol | Type | Description | Parameter/Value |
|---|---|---|---|
| d1 | TeliusODP | Pre-process data | CD1 / Step=1 / SysRcpSeq=1 / FilterType=None |
| f1 | FeedbackOffset | FB Plan1 | 0.0 |
| o1 | Desired Output | Desired Process Result | 65.0 |

Target Calculation, t = f(d, o, f)

| tx | | f(dx, ox, fx) | |
|---|---|---|---|
| t1 | = | d1-o1 | |
| t2 | = | d1-o1+f1 | |
| t3 | = | d1-o1+f2 | |

Model Selections

| # | Model Type | Model Name | Target | Lower Limit | Upper Limit | Static Recipe Output (y) |
|---|---|---|---|---|---|---|
| 1 | Formula Model | PCMO-Trim-1 | t1 | 0.0 | 10.0 | |
| 2 | Formula Model | PCMO-Trim-Host | t2 | 10.0 | 100.0 | |
| 3 | Formula Model | R2R_test_equation1 | t3 | 100.0 | 190.0 | |
| 4 | Formula Model | R2R_test_equation1 | t4 | 190.0 | 280.0 | |
| 5 | Formula Model | R2R_test_equation2 | t5 | 190.0 | 280.0 | |
| 6 | Formula Model | R2R_test_equation2 | t6 | 280.0 | 370.0 | |

Predicted result Calculation (Used in feedback plan)

p1 = y

[ Save ] [ Cancel ] [ Help ]

FIG. 22

| R2R Control Plan Editor | | | | | | | ☒ |
|---|---|---|---|---|---|---|---|
| Plan Name: | CTRL-PLAN-A | | Module: | PM01 | | Recipe: | A-IEM-POLY/P1/NAKA/NAKA-POLY |
| Description: | | | | ☐ Send alarm on FB plan update | Updated: | 2004-03-05 17:01:25 | |

Data Sources

| Symbol | Type | Description | Parameter/Value |
|---|---|---|---|
| o2 | Desired Output | Desired Process Result (from host) | 95.949 |
| d2 | TeliusODP | Post-process data | CD1 / Step=1 / SysRcpSeq=1 / FilterType=None |
| f2 | FeedbackOffset | Feedback Value from Host | 0.983 |

Target Calculation, $t = f(d, o, f)$

| tx | | f(dx, ox, fx) | |
|---|---|---|---|
| t4 | = | d2-o2 | |
| t5 | = | d2-o1+f1 | |
| t6 | = | d2-o1+f2 | |

Model Selections

| # | Model Type | Model Name | Target | Lower Limit | Upper Limit | Static Recipe Output (y) |
|---|---|---|---|---|---|---|
| 1 | Formula Model | PCMO-Trim-1 | t1 | 0.0 | 10.0 | |
| 2 | Formula Model | PCMO-Trim-Host | t2 | 10.0 | 100.0 | |
| 3 | Formula Model | R2R_test_equation1 | t3 | 100.0 | 190.0 | |
| 4 | Formula Model | R2R_test_equation1 | t4 | 190.0 | 280.0 | |
| 5 | Formula Model | R2R_test_equation2 | t5 | 190.0 | 280.0 | |
| 6 | Formula Model | R2R_test_equation2 | t6 | 280.0 | 370.0 | |

Predicted result Calculation (Used in feedback plan)

p1= y

Target Calculation: Define calculated targets (i.e., t[1-9]) in terms of {d|o|f}[1-9] defined in Data sources. Suggested: t1=d1-o1-f1

[ Save ]  [ Cancel ]  [ Help ]

FIG. 23

R2R Feedback Plan Editor

Plan Name: FBPlan1

Description: FB Lambda passed from host

Data Sources

| Symbol | Type | Description | Parameter Value |
|---|---|---|---|
| d1 | TeliusOOP | pre-process data | CD1 / Step=1 / SysRecSeq=1 / FilterType=None |
| d2 | ControlPlanValue | predicted value | CTRL-PLAN-A / p1 |
| d3 | ControlPlanValue | host value | CTRL-PLAN-A / o1 |
| d4 | TeliusOOP | post-process data | CD1 / Step=1 / SysRecSeq=1 / FilterType=None |

Actual Process Result Calculation a1= d2

Error Calculation e1= (a1-d1) * d3

Control Pain Selections

| Module | Control Plan | Symbol | Current Value | Last Update | Lambda | Enable Deadband | Deadba |
|---|---|---|---|---|---|---|---|
| PM01 | CTRL-PLAN-A | f1 | 0 | 2004-01-30 14:04:18.875 | 1 | ☐ | |

Actual Process Result Calculation: Define the result calculation in terms of [d|o|l](1-9) defined in Data Sources

[Save] [Cancel] [Help]

FIG. 24

FORMULA-BASED RUN-TO-RUN CONTROL

CROSS-REFERENCE TO RELATED APPLICATIONS

This application is related to co-pending U.S. patent application Ser. No. 10/705,200, entitled "Processing System And Method For Chemically Treating A Substrate", filed on Nov. 12, 2003; co-pending U.S. patent application Ser. No. 10/704,969, entitled "Processing System And Method For Thermally Treating A Substrate", filed on Nov. 12, 2003; and co-pending U.S. patent application Ser. No. 10/705,397, entitled "Method And Apparatus for Thermally Insulating Adjacent Temperature Controlled Chambers", filed on Nov. 12, 2003. The contents of each of these applications are herein incorporated by reference in their entireties.

BACKGROUND OF THE INVENTION

1. Field of the Invention

The present invention relates to a system and method for processing a substrate, and more particularly to a system and method for using formula-based recipes for run to run control.

2. Description of the Related Art

Throughout the various stages of plasma processing, such as semiconductor or display manufacturing, etc., process parameters may vary significantly. Processing conditions change over time with the slightest changes in process parameters creating undesirable results. Small changes can easily occur in the composition or pressure of an etch gas, process chamber, or wafer temperature. As such, plasma processing facilities require constant monitoring.

The measuring and monitoring of these process parameters at any given time permits valuable data to be accumulated and analyzed. Process control feed-back may be used to adjust the process parameters or determine the viability of certain process materials. However, in many cases, changes of process data reflecting deterioration of processing characteristics cannot be detected by simply referring to the process data displayed. As such, it may be difficult to detect early stage abnormalities and characteristic deterioration of a process, and often may be necessary to obtain fault detection and prediction, as well as pattern recognition by an advanced process control (APC). Often times a processing tool is not connected to an APC system and the data on the processing tool is not adequately used.

SUMMARY OF THE INVENTION

For these and other reasons, the principles of the present invention, as embodied and broadly described herein, are directed to a method of processing a substrate comprising: receiving pre-process data, wherein the pre-process data comprises a desired process result and actual measured data for the substrate, determining a required process result, wherein the required process result comprises the difference between the desired process result and the actual measured data and creating a new process recipe by modifying a nominal recipe obtained from a processing tool using at least one of a static recipe and a formula model, wherein the new process recipe provides a new process result that is approximately equal to the required process result. The nominal recipe comprises a plurality of process steps, each step having a plurality of process parameters defined therein, wherein the static recipe comprises at least one constant value for further defining at least one of the process parameters in at least one of the process steps, and wherein the formula model comprises at least one dynamic variable for further defining at least one of the process parameters in at least one of the process steps. The method further comprises sending the new process recipe to the processing tool and processing the substrate.

In addition, the invention provides a method of processing a substrate that includes receiving pre-process data, wherein the pre-process data comprises a desired process result and actual measured data for the substrate, determining a required process result, wherein the required process result comprises the difference between the desired process result and the actual measured data, and identifying a control strategy to create a new process recipe, wherein the new process recipe provides a new process result that is approximately equal to the required process result and the control strategy comprises at least one of a control plan for static recipes comprising a plurality of static recipes, and a control plan for formula models comprising a plurality of formula models.

The method further comprises determining a nominal recipe, wherein the nominal recipe comprises a first table having a first number of columns and a second number of rows, each column comprising a process step and each row comprising a process parameter, each cell comprising a process parameter value; executing at least one of a static recipe and a formula model to modify a process parameter value associated with at least one cell in the first table, a static recipe comprising a second table having the first number of columns and the second number of rows, at least one cell of the second table comprising a constant value for modifying a process parameter value associated with at least one cell in the first table, and a formula model comprising a third table having the first number of columns and the second number of rows, at least one cell of the third table comprising a dynamic variable for modifying a process parameter value associated with one or more cells of the first table; and sending the new process recipe to the processing tool and processing the substrate.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 illustrates an exemplary view of a configuration screen in accordance with an embodiment of the invention;

FIG. 8 illustrates an exemplary view of an editor screen in accordance with an embodiment of the invention;

FIG. 9 illustrates an exemplary view of a Control Strategy Editor screen in accordance with an embodiment of the invention;

FIG. 10 illustrates an exemplary view of Control Plan Editor screen in accordance with an embodiment of the invention;

FIG. 13 illustrates an exemplary view of a R2R Formula Model Editor screen in accordance with an embodiment of the invention;

FIG. 16 illustrates an exemplary view of a R2R Static Recipe Editor screen in accordance with an embodiment of the invention;

FIG. 17 illustrates an exemplary nominal recipe in accordance with an embodiment of the invention;

FIG. 19 illustrates an exemplary view of a R2R Formula Model Editor screen in accordance with an embodiment of the invention;

FIG. 20 illustrates an exemplary view of another R2R Formula Model Editor screen in accordance with an embodiment of the invention;

FIG. 21 illustrates an exemplary view of another R2R Formula Model Editor screen in accordance with an embodiment of the invention;

FIG. 22 illustrates an exemplary view of a R2R Control Plan Editor screen in accordance with another embodiment of the invention;

FIG. 23 illustrates an exemplary view of a R2R Control Plan Editor screen in accordance with another embodiment of the invention; and FIG. 24 illustrates an exemplary view of a R2R Feed-back Plan Editor screen in accordance with another embodiment of the invention.

DETAILED DESCRIPTION

In material processing methodologies, pattern etching comprises the application of a thin layer of light-sensitive material, such as photoresist, to an upper surface of a substrate that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including, but not limited to, silicon dioxide ($SiO_2$), silicon nitride ($Si_3N_4$), and carbon.

Figure 1:
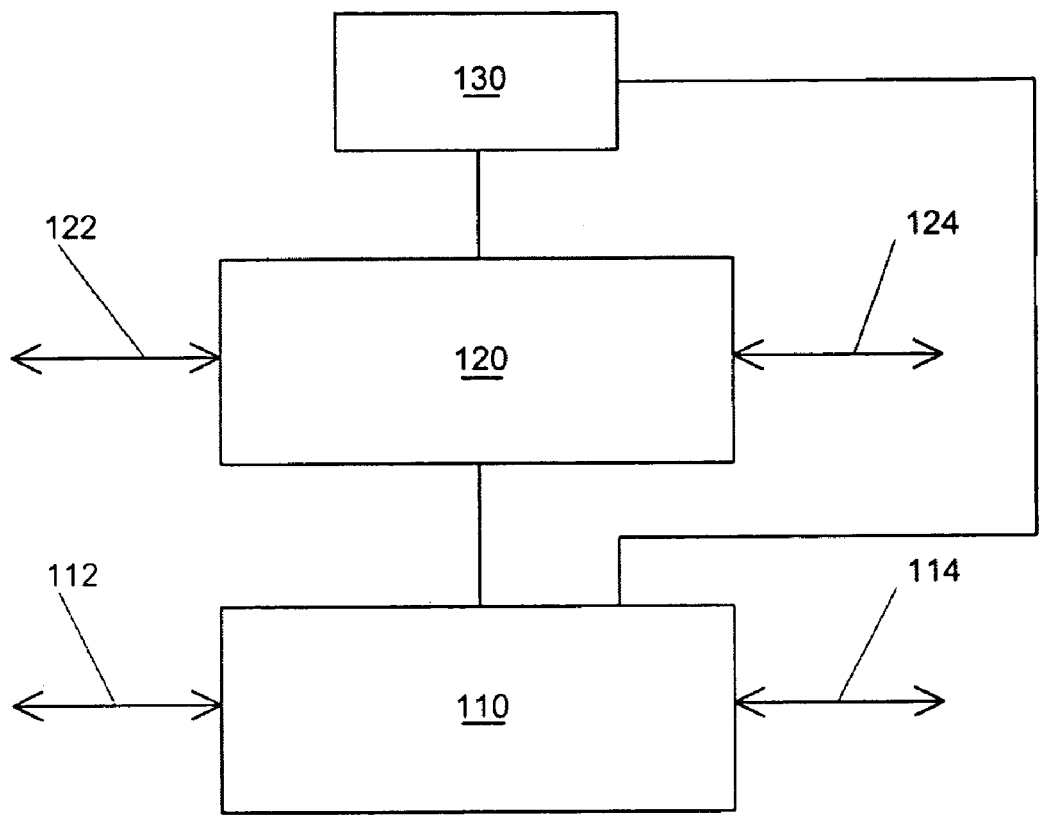
FIG. 1 shows an exemplary block diagram of a processing system in accordance with an embodiment of the present invention.

FIG. 1 shows an exemplary block diagram of a processing system in accordance with an embodiment of the present invention. In the illustrated embodiment, processing system 100 comprises a processing tool 110, a controller 120 coupled to the processing tool 110, and a manufacturing equipment system (MES) 130 coupled at least to the controller 120. In addition, at least one of the processing tool 110, the controller 120, and the MES 130 can comprise a GUI component and/or a database component (not shown). In alternate embodiments, the GUI component and/or the database component are not required.

Some setup and/or configuration information can be obtained by the processing tool 110 and/or the controller 120 from the factory system 130. Factory level business rules can be used to establish a control hierarchy. For example, the processing tool 110 and/or the controller 120 can operate independently, or can be controlled to some degree by the factory system 130. Also, factory level business rules can be used to determine when a process is paused and/or stopped, and what is done when a process is paused and/or stopped. In addition, factory level business rules can be used to determine when to change a process and how to change the process.

Business rules can be used to specify the action taken for normal processing and the actions taken on exceptional conditions. The actions can include, inter alia: initial model loading, pre-etch metrology data filtering, controller recipe selection, post-etch metrology data filtering, feed-back calculation, and a model update.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can be configured to monitor some system processes using data reported from the databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system 130. Also, factory level business rules can be used to determine how to manage the data when a process is changed, paused and/or stopped.

Also, the MES 130 can provide run-time configuration information to the processing tool 110 and/or the controller 120. For example, automated process control (APC) settings, targets, limits, rules, and algorithms can be downloaded from the factory to the processing tool 110 and/or the controller 120 as an "APC recipe", an "APC system rule", and "APC recipe parameters" at run-time.

Some setup and/or configuration information can be determined by the processing tool 110 and/or the controller 120 when they are initially configured by the processing system 100. System level business rules (system rules) can be used to establish a control hierarchy. For example, the processing tool 110 and/or the controller 120 can operate independently, or the processing tool 110 can be controlled to some degree by the controller 120. Also, system rules can be used to determine when a process is paused and/or stopped, and what is done when a process is paused and/or stopped. In addition, system rules can be used to determine when to change a process and how to change the process. Furthermore, the controller 120 can use tool level rules to control some tool level operations.

In general, rules allow system and/or tool operation to change based on the dynamic state of the processing system 100.

In FIG. 1, one processing tool 110, and one controller 120 are shown, but this is not required for the invention. The semiconductor processing system can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. Among other functions, the processing tool 110 and/or the controller 120 can collect, provide, process, store, and display data from processes involving processing tools, processing subsystems, process modules, and sensors.

The processing tool 110 and/or the controller 120 can comprise a number of applications including at least one tool-related application, at least one module-related application, at least one sensor-related application, at least one interface-related application, at least one database-related application, at least one GUI-related application, and at least one configuration application, among others.

For example, the system 100 can comprise an APC system from Tokyo Electron Limited that can include a Unity Tool, Telius Tool and/or a Trias Tool and their associated processing subsystems and process modules. In addition, the system can comprise a run-to-run (R2R) controller, such as the Ingenio TL ES server from Tokyo Electron Limited, and an integrated metrology module (IMM) from Tokyo Electron Limited.

Figure 2:
FIG. 2 shows an exemplary view of a GUI screen for a processing tool in accordance with an embodiment of the invention.

Alternately, the controller 120 can support other process tools and other process modules. FIG. 2 shows an exemplary view of a GUI screen for a processing tool in accordance with an embodiment of the invention.

A GUI component (not shown) can provide easy-to-use interfaces that enable users to: (a) view tool status and process module status; (b) create and edit x-y charts of summary and raw (trace) parametric data for selected wafers; (c) view tool alarm logs; (d) configure data collection plans that specify conditions for writing data to the database or to output files; (e) input files to statistical process control (SPC) charting, modeling and spreadsheet programs; (f) examine wafer processing information for specific wafers, and review data that is currently being saved to the database; (g) create and edit SPC charts of process parameters, and set SPC alarms which generate e-mail warnings; (h) run multivariate PCA and/or PLS models; and (i) view diagnostics screens in order to troubleshoot and report problems with the TL controller 120. As should be apparent to those skilled in the art, the GUI component need not provide interfaces for all functions. Instead the GUI may provide interfaces for any subset of these functions or others not listed here.

Raw data and trace data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures; to view status including tool, controller, process, and factory status; to view current and historical data; to perform modeling and charting functions; and to input data to the controller. For example, a user may be provided with administrative rights that allow him to control one or more processes performed by a controller.

The controller 120 can comprise links 122, 124 for coupling to at least one other controller. For example, other controllers can be associated with a process that has been performed before this process, and/or other controllers can be associated with a process that is performed after this process. The link 122 and the link 124 can be used to feed-forward and/or feed-back information.

The processing tool 110 and the controller 120 can be coupled to the MES 130 and can be part of an E-Diagnostic System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include, among other things, final CD targets, limits, offsets, and variables in the tool level system that need to be adjustable by lot. Also, factory litho CD metrology data can be feed-forwarded to the controller 120.

Furthermore, the MES 130 can be used to provide measurement data, such as CD SEM information, to the controller 120. Alternately, the CD SEM information can be provided manually. Adjustment factors are used to adjust for any offset between the IM and CD SEM measurements. Manual and automated input of CD SEM data includes a timestamp, such as a date, for proper insertion in to the history of the FB control loop in the R2R controller.

Configurable items can be configured as a set of variable parameters sent from the factory system using GEM SECS communications protocol. For example, variable parameters can be passed as part of an "APC Recipe". An APC recipe may contain more than one sub recipes and each sub recipe can contain variable parameters.

The controller 120 is coupled to the processing tool 110 and MES 130, and information such as feed-back and feed-forward data can be exchanged between them. For example, when an internal reset event is being generated from the tool, the controller 120 can send a message, such as an alarm, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but this is not required for the invention. Alternately, additional controllers can be used. For example, the controller 120 can comprise at least one of a run-to-run (R2R) controller, a feed-forward (FF) controller, a process model controller, a feed-back (FB) controller, and a process controller (all not shown in FIG. 1).

A single processing tool 110 is also shown in FIG. 1, but an arrangement including only one processing tool 110 is not required for the invention. Alternately, additional processing tools can be used. In one embodiment, the processing tool 110 can comprise a process chip (not shown) that can include a COR module, a PHT module, and a buffer (LL) module. The processing system 100 can be controlled using separate recipes, the COR module, the PHT module, and/or the buffer (LL) module. Alternately, the processing tool 110 can comprise at least one of an etch module, a deposition module, a polishing module, a coating module, a developing module, and a thermal treatment module, among others.

In one embodiment, a COR module can perform a portion of a COR process. This portion can be a reaction between a mixture of process gases, such as HF and ammonia gases and silicon dioxide, which forms a solid reaction product on the wafer surface. The PHT module, located next to the COR module, performs the second portion of the COR process. This portion of process is called Post Heat Treatment (PHT). This step causes the evaporation of the solid reaction product by heating the wafer.

For example, a buffer module can comprise a transfer system for transferring a wafer between the COR module, the PHT module, the buffer (LL) module, and another module, such as another transfer system module. These process modules can be included as additional module types for the TL controller to control.

The processing tool 110 can use a COR recipe to start the processing and a COR recipe can begin when a substrate is transferred to the COR module. For example, the substrate can be received by lift pins that are housed within a substrate holder, and the substrate can be lowered to the substrate holder. Thereafter, the substrate can be secured to the substrate holder using a clamping system, such as an electrostatic clamping system, and a heat transfer gas can be supplied to the backside of the substrate.

Next, the COR recipe can be used to set one or more chemical processing parameters for the chemical treatment of the substrate, and these parameters can include at least one of a chemical treatment processing pressure, a chemical treatment wall temperature, a chemical treatment substrate holder temperature, a chemical treatment substrate temperature, a chemical treatment gas distribution system temperature, a chemical treatment processing chemistry, including process gasses and flows. Then, the substrate can be chemically treated for a first period of time. The first period of time can range from 30 to 360 seconds, for example.

Next, the substrate can be transferred from the chemical treatment chamber to the PHT module. During which time, the substrate clamp can be removed, and the flow of heat transfer gas to the backside of the substrate can be terminated. The substrate can be vertically lifted from the substrate holder to the transfer plane using the lift pin assembly housed within the substrate holder. The transfer system can receive the substrate from the lift pins and can position the substrate within the PHT module. Therein, the substrate lifter assembly can receive the substrate from the transfer system, and can lower the substrate to the substrate holder.

Then, the PHT recipe can be used to set one or more thermal processing parameters for thermal treatment of the substrate by the PHT module can be set and the substrate can thermally treated for a second period of time. For example, the one or more thermal processing parameters can comprise at least one of a thermal treatment wall temperature, a thermal treatment upper assembly temperature, a thermal treatment substrate temperature, a thermal treatment substrate holder temperature, a thermal treatment substrate temperature, a thermal treatment processing pressure, and a thermal treatment processing chemistry, including process gasses and flows. The second period of time can range from 30 to 360 seconds, for example.

The processing tool 110 can comprise links 112, 114 for coupling to at least one other processing tool and/or controller. For example, other processing tools and/or controllers can be associated with a process that has been performed before this process, and/or other controllers can be associated with a process that is performed after this process. The link 112 and link 114 can be used to feed-forward and/or feed-back information. For example, feed-forward information can comprise data associated with an in-coming wafer. This data can include lot data, batch data, run data, composition data, and wafer history data. The data can comprise pre-process data that can be used to establish an input state for a wafer. A first part of the pre-process data can be provided to the controller 120, and a second part of the pre-process data can be provides to the processing tool 110. Alternately, the two parts can comprise the same data.

The processing tool 110 can comprise a single integrated metrology module (IMM) device (not shown) or multiple measurement devices. The system 100 can include module related measurement devices, tool-related measurement devices, and external measurement devices. For example, data can be obtained from sensors coupled to one or more process modules and sensors coupled to the processing tool 110. In addition, data can be obtained from an external device such as a SEM tool and an Optical Digital Profiling (ODP) tool. An ODP tool is available for Timbre Technologies Inc. (a Tokyo Electron Limited company) that provides a patented technique for measuring the profile of a feature in a semiconductor device.

Figure 3:
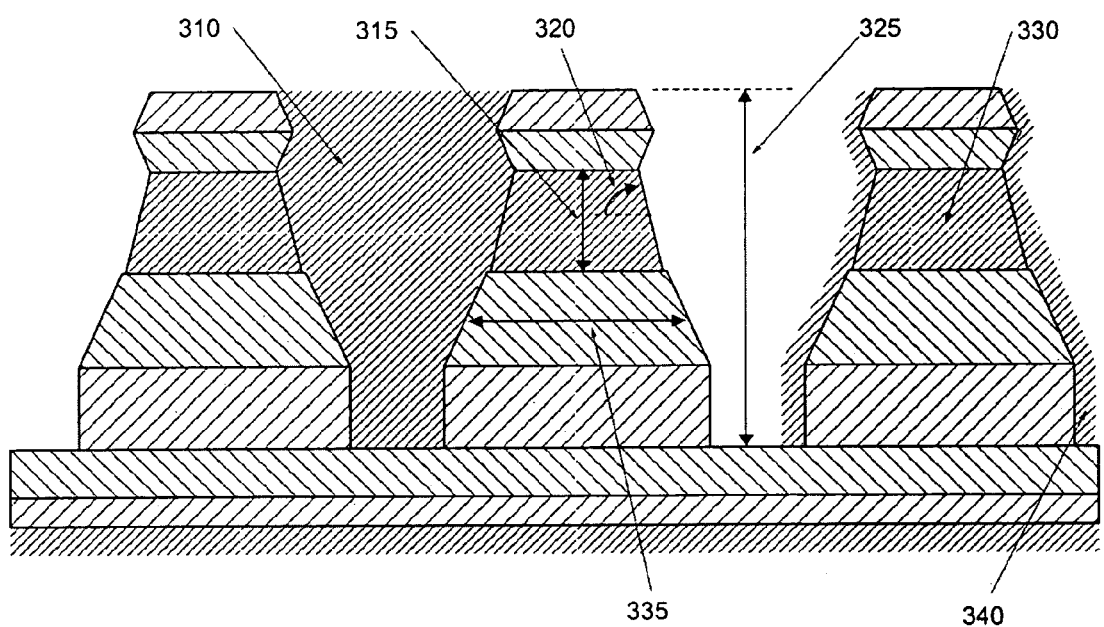
FIG. 3 shows an exemplary view of a wafer cross-section in accordance with an embodiment of the invention.

FIG. 3 shows an exemplary view of a wafer cross-section in accordance with an embodiment of the invention. For example, the measured data can include trench area data 310, material thickness data 315, sidewall angle data 320, grating thickness data 325, cross sectional area data 330, CD data 335, and differential width data 340. As should be appreciated by those skilled in the art, other measure data may be acquired. The listing of measurement data is, therefore, merely exemplary of the wide variety of measured data that can be acquired for use by the invention.

Referring back to FIG. 1, the controller 120 can use the difference between the measured data of the incoming material (input state) and target data (desired state) to predict, select, or calculate a set of process parameters to achieve the desired result of changing the state of the wafer from the input state to the desired state. For example, this predicted set of process parameters can be a first estimate of a recipe to use based on an input state (measured CD) and a desired state (target CD). In one embodiment, data such the input state and/or the desired state data can be obtained from a host.

In one case, the controller 120 determines the input state and desired state for the wafer, and the controller 120 determines a set of recipes that can be performed on the wafer to change the wafer from the input state to the desired state. For example, the set of recipes can describe a multi-step process involving a set of process modules.

The controller 120 can use formula-based techniques, and a rule for determining when to switch between processing regimes can be based on at least one of an input range, an output range, a wafer type, a process type, a module type, a tool type, a wafer state, and a process state. When the controller 120 uses formula-based techniques, the feedforward control variables can be configurable. For example, a variable can be a constant or coefficient in a formula or an equation. In addition, there are multiple formulas, and a rule for determining when to switch between formulas can be based on an input range or an output range.

One time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers 120 can be operating at any point in time. For example, one controller 120 can be in an operating mode while a second controller 120 can be in a monitoring mode. In addition, another controller 120 can be operating in a simulation mode. A controller can comprise a single loop or multiple loops, and the loops can have different time constants. For example, loops can be dependent on wafer timing, lot timing, batch timing, chamber timing, tool timing, and/or factory timing.

The controller 120 can operate as a single input single output (SISO) device, as a single input multiple output (SIMO) device, as a multiple input single output (MISO) device, and/or as a multiple input multiple output (MIMO) device, among other variants. In addition, inputs and outputs can be within one controller 120 and/or between one or more controllers 120. For example, when multiple inputs such as CD and sidewall angle are being used, inputs and outputs can be fed forward and backward between two modules (i.e., one for CD control and one for sidewall angle control). In addition, a mask open controller can also be used. In a multi-process case including multiple modules, information can be fed-forward or fed-back from one controller to another controller.

When a processing tool and/or process module sends data to the database, this data can be accessed by the controller 120. For example, this data can comprise tool trace data, maintenance data, and end point detection (EPD) data. The trace data can provide important information about the process. The trace data can be updated and stored during processing or after the processing of a wafer is completed.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. Also, models can include SPC charts, PLS models, PCA models, FDC models, and MVA models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller 120 can receive and execute models (PLA, PCA, etc.) that were created by external applications and sent to the controller 120.

In addition, the controller 120 can receive post-process data that can be used to establish an output state for a wafer. A first part of the post-process data can be provided to the controller 120, and a second part can be provided to the database along with wafer out event 114. Alternately, the two parts can comprise the same data. A post-process metrology module can comprise a single or multiple measurement devices. A post-process metrology module can comprise process module related measurement devices, tool-related measurement devices, and external measurement devices, among others. For example, post-processing data can be obtained from sensors coupled to one or more process modules and sensors coupled to the processing tool. In addition, post-processing data can be obtained from an external device such as a SEM tool, an OES tool, and an Optical Digital Profiling (ODP) tool.

The controller 120 can use the post-processing data to compute a first set of process deviations. This computed set of process deviations can be determined based on an anticipated wafer state and the output state for the wafer determined from the post-processing data. In one case, the controller 120 knows the desired state and output state for the wafer, and the controller 120 determines the differences between the desired state and the output state. In this manner, the measured actual process results are compared with the desired process results in order to determine a correction to the process recipe. In another case, the controller 120 knows the predicted state and output state for the wafer, and the controller 120 determines the differences between the predicted state and the output state. In this manner, the measured actual process results are compared with the predicted process results in order to determine a correction to the process model.

Model updates are another form of feed-back that can take place by running monitor wafers, varying the process settings and observing the results, then updating the model. For example a model update can take place every N processing hours by measuring the before and after film characteristics of a monitor wafer. By changing the settings over time to check different operating regions one could validate the complete operating space over time, or run several monitor wafers at once with different recipe settings. The model update can take place within the controller 120 at the tool or at the factory, allowing the factory control to manage the monitor wafers and model updates.

The controller 120 can compute an updated recipe for the next wafer. In one case, the controller 120 can use the feed-forward information, modeling information, and the feed-back information to determine whether or not to change the current recipe before running the current wafer. In another case, the controller 120 can use the feed-forward information, modeling information, and the feed-back information to determine whether or not to change the current recipe before running the next wafer. Alternately, the controller 120 can use the feed-forward information, modeling information, and the feed-back information to determine whether or not to change the current recipe before running the next lot.

When a metrology data source is being used to provide process result data, a route sequence can be specified which causes a substrate to be routed to the IM module at the correct point in the process. For example, a substrate can be routed to an IM module before entering a processing module and/or after the substrate has been processed in a processing module. In addition, an IM recipe can be specified which causes a set of pre-determined measurements to be made and a pre-determined set of output data to be provided. For example, one result can be a vector of data that represents the value of a measured parameter for each site that was measured with the IM recipe. Before the data is averaged and used by the controller 120, a site filter can be used to remove outlying sites.

The controller 120 can comprise one or more filters (not shown) to filter the metrology data in order to remove the contributions of random noise. For example, a filter can be applied to the input or to the output of the controller 120. In one case, the filter can be applied to the incoming variable for filtering without concern of the method of control (i.e., independent of using a lookup table). This also enables the controller 120 to change output variables over a range of control, such as changing a flow rate in small steps, then making a change in pressure and stair stepping a flow rate change.

An outlier filter can be used to remove outliers that are statically not valid and should not be considered in the calculation of the mean of a wafer measurement. The outlier filter can be used to eliminate both high and low outliers from a mean value. For example, a box and whisker method can be applied to the site metrology data. This method is effective, simple to maintain without absolute limits, allows one set of filtering limits to be applied to a varying set of incoming CD mean data (the target can change without affecting the filter limits) and is simple to visualize. With an outlier filter, additional rules need to be maintained (minimum number of points in a wafer to statically represent the wafer and the minimum number of wafers to represent a lot).

A noise filter can be used to remove random noise and stabilize the control loop. For example, an Exponentially Weighed Moving Average (EWMA) or Kalman filter can be applied. When a filter is used, the filter time constant has to be set. In the case of a EWMA, lambda is the time constant. In one example, EWMA calculations can be made using the complete history each time in order to capture data points that are added out of order, by processing date and time.

The controller 120 can receive and utilize feed-forward data. For example, the controller 120 can receive information about incoming material to be processed and the desired process results (target CD), and the controller 120 can provide a set of recipe parameters to achieve the desired process results. The controller 120 can receive and utilize feedback data. For example, the controller 120 can receive information about material that has already been processed and adjust the process model based on this data. The controller 120 can receive and utilize feedback data that is delayed. For example, the controller 120 can receive information about material that has already been processed and adjust the process model based on this data even though the data is not received in the order in which it was processed by the tool. The controller 120 can receive and utilize manually entered data for configuring and controlling the controller. For example, the controller GUI component provides a means for the manual input of the controller configuration information.

The controller 120 can send and receive notification of an exception condition. For example, the controller 120 can send and receive notifications to and from a factory level controller, a R2R controller, and/or a tool level controller, among other devices. In addition, a notification can be sent via the e-Diagnostics network, e-mail, or pager after the identification of an exception condition.

The controller 120 can run in a simulated mode. For example, the controller 120 can operate in simulation mode in parallel with the actual process mode. In this case, the simulated actions can be recorded in the controller log and historical database, and immediate action is not taken.

The controller 120 can select process models based on incoming material context. For example, the controller 120 can select process models based on the incoming material state and process recipe. The controller can comprise means to verify that the system 100 can calculate a valid R2R setting. For example, the controller 120 can comprise hardware and/or software to verify recipe parameter settings prior to lot start. The controller 120 can comprise hardware and/or software to use default settings of recipe set points. For example, when the controller 120 cannot provide recipe parameters for a particular wafer, the recipe parameters in the "nominal" recipe can be used.

The controller 120 can comprise a database component for archiving input and output data. For example, the controller can archive, among other things, received inputs, sent outputs, and actions taken by the controller in a searchable database. In addition, the controller 120 can comprise hardware and/or software for data backup and restoration. Also, the searchable database can include model information, configuration information, and historical information and the controller 120 can use the database component to backup and restore model information and model configuration information both historical and current.

The controller 120 can comprise a web-based user interface. For example, the controller 120 can comprise a web enabled GUI component for viewing the data in the database. The controller can comprise a security component that can provide for multiple levels of access depending on the permissions granted by a security administrator. The controller 120 also can comprise a set of default models that are provided at installation time and have the ability to reset to default conditions.

The controller 120 can take various actions depending on the nature of the exception. For example, exception conditions can include, among other things, missing measured data, missing target CD, metrology error, recipe parameter limit exceeded, process module parameter limit exceeded, and feed-back event received out of order. The actions taken based on exception can be premised on the business rules established for the context specified by the system recipe, process recipe, module type, module identification number, load port number, cassette number, lot number, control job ID, process job ID, or slot number, for example. The context can be arranged in a hierarchy from the highest level to the lowest level. Matching a context at a higher level can override matching a context at a lower level. If no matching context is found, the default action can be taken.

The controller 120 inputs can include, for example, Instructions, Substrate State, Module Physical State, Process State, and Controller Parameters. In addition, the controller inputs can include time constants for feed-forward/feed-back loops, a reset event for accumulation, an IMM step, and ODP offset, among others. Instructions can include, interalia, targets, tolerances, computational commands, data collection plans, algorithms, models, coefficients, and recipes. The Substrate State can include information, for example, from the substrate being processed (site, wafer, lot, batch state), profiles, and characteristics measured physically or electrically. The Module Physical State can include the current or last known recorded state of the module and components that will be used to process the substrate—RF hours, number of wafers, consumable states. The Process State can include the current or last known measured state from sensors of the processing environment, including trace data, and summary statistics. The Controller Parameters can include the last settings for the recipe/controller set points and process targets that created the substrate state, module physical state, and process state.

The controller outputs can include derived parameters, settings, an event or message, intervention, derived context, log message, and history, to name a few. For example, one parameter can be data to be sent to offline systems for analysis. The derived parameters can include information generated by the controller 120 that can represent the state of the controller 120, the process, the material, or the equipment. Settings can include process tool parameters that are calculated by the controller 120 and are typically downloaded to the tool 110 at runtime. For example these parameters can include time by step, pressure, temperature, gas flows, and power. An event or message can include information indicating that an exception has occurred in the system being controlled. Intervention can include information concerning an action that is recommended (or taken) by the controller based on analysis results. Derived context can include context information that is derived by the controller. The log message can be a text message describing the activities of the controller. The history item can include data to be sent to offline systems for a Decision Support System (DSS) type of analysis.

The controller 120 can comprise at least one computer and software that supports at least one controller application. The controller can comprise at least one storage device that stores data. For example, at least one computer can comprise operational software, such as the Ingenio software, from Tokyo Electron. In one case, the operational software comprises at least one of: a configuration means, a data management means, a GUI means, a fault management means, and a trouble-shooting means. Also, configuration GUI screens can be used to configure the interface between the computer and the processing element, to determine the device type for the processing element (i.e., tool, module, sensor, etc.). Data management GUI screens can be used to determine the amount and type of data to collect and to determine how to and where to store the collected data. Furthermore, fault management GUI screens can be used to inform a user about fault conditions.

In general, feed-forward control is the updating of a process module recipe using pre-process data measured on the wafer prior to its arrival in the process module. In one case, metrology data and process target data are received by the controller 120. These values can be compared, and the result is the desired process result (for example, the desired trim amount). Then, this desired process result can be sent to the controller for model selection and calculation of the appropriate process recipe parameters. This new recipe is sent to the process module and the wafer is processed (trimmed) using the new recipe.

In the system 100, feed-forward control can be implemented, in the controller 120, by configuring Control Strategies, Control Plans, and Control Models. A Control Strategy can be written for each system recipe where feed-forward control is implemented. When this system recipe executes in the processing tool 110, the Control Plans within the Control Strategy can be executed. Each control plan can be used to modify the recipe based on feed-forward information. With the control plan, a user can specify the input parameters (called Data Sources).

Using these inputs a user can specify a calculation for the target calculation. The result of this calculation is then used to choose which control model to execute. The control models can either be Static Recipes (a fixed recipe for the entire target calculation range) or a Formula Model (a model that allows the value of process recipe parameters to vary based on an exact calculation). From the results of Static Recipe or the Formula Model, modifications to the process recipe are made. The system starts with the Nominal Recipe (the recipe as it exists on the tool). Then, the updates from each executed Control Plan are added. Once all the Control Plans are executed (within the matching Control Strategy), the final recipe is sent to the tool.

The controller 120 can be thought of as a recipe parameter solver that produces recipe parameters according to appropriate process model, process model constraints, process targets, and process parameter constraints. The controller 120 has the capability of managing multiple process models that are executed at the same time and are subject to a single set of process recipe constraints.

The controller 120 and/or the processing tool 110 can detect control failures. Among other parameters, the controller 120 can detect metrology data failures and recipe selection failures. The processing tool 110 can detect, inter alia, recipe reception timeouts, integration communication failures, and synchronization failures. When the system recipe synchronization fails on the processing tool 110, processing is not started. If control failure occurs, the controller 120 can be configured to use the tool process recipe (nominal recipe), use the null recipe, or to stop Run-to-Run control (according to tool parameter settings). To pause the tool 110, the controller 120 can be configured to pause the process module, or to pause the entire system 100.

If there is a conflict between the processing tool 110 and the controller 120, a warning alarm can be displayed and processing can continue using the process recipe specified in the system recipe. This allows an operator or a higher level controller to decide whether or not to continue processing with the process recipe or to abort the wafer.

Figure 4:
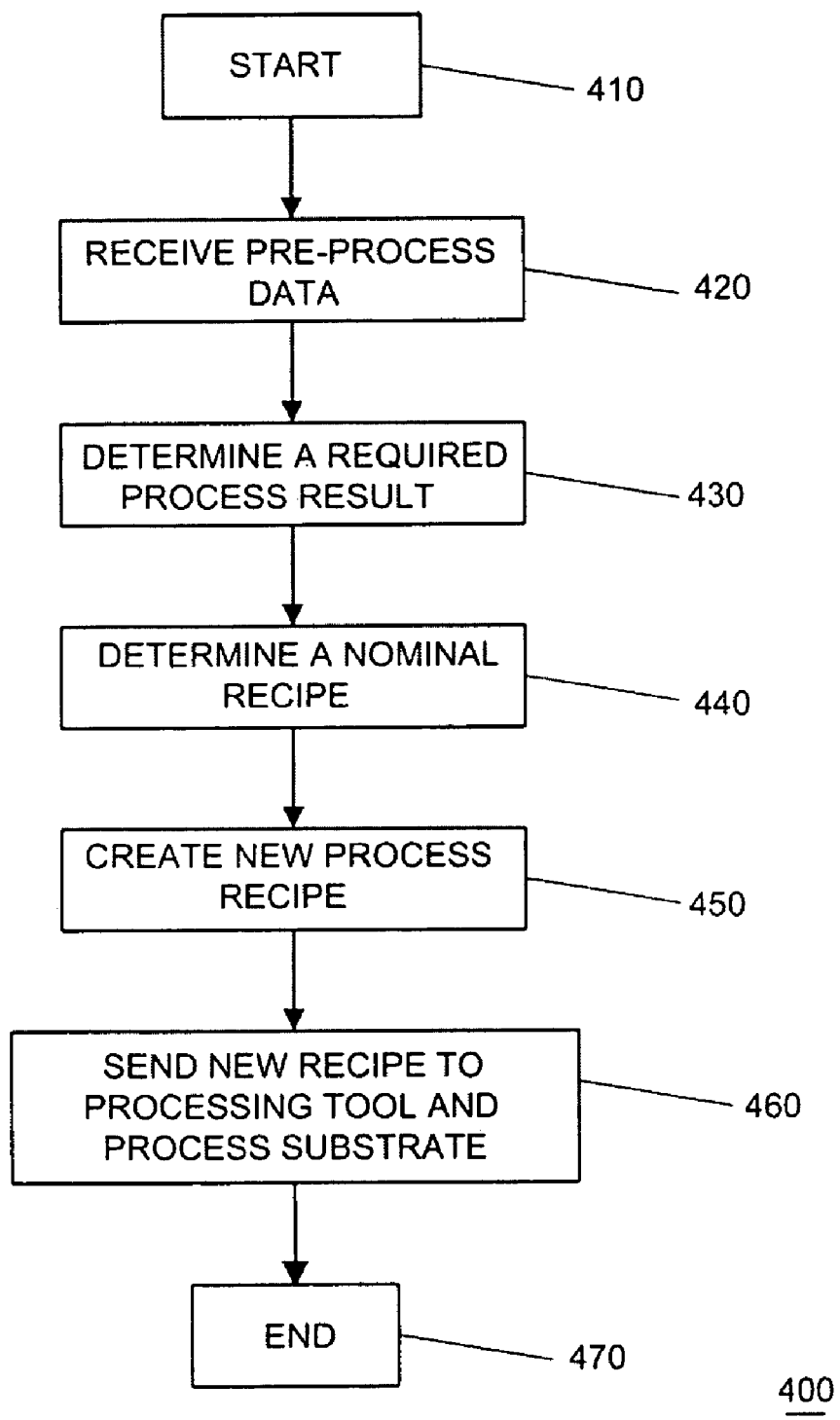
FIG. 4 illustrates an exemplary flow diagram of a method for operating a processing system in accordance with an embodiment of the invention.

FIG. 4 illustrates an exemplary flow diagram of a method for operating a processing system in accordance with an embodiment of the invention. Procedure 400 starts at task 410.

In task 420, pre-process data can be received. Pre-process data can comprise a desired process result for the substrate and current measurement data. The current measurement data can comprise actual measured data for the substrate. In addition, pre-process data can include Goodness Of Fit (GOF) data, grating thickness data, Critical Dimension (CD) data, uniformity data, CD profile data, CD profile uniformity data, Material Thickness data, Material Cross Section Area data, Trench Cross Section Area data, Sidewall Angle data, Differential Width data, Site Result data, Site number data, CD Measurement Flag data, Number of Measurement Sites data, Recipe Result data, Coordinate X data, and Coordinate Y data, among others.

Pre-process data can be used for feed-forward control, and some of the data can be summarized as the statistical value for the control wafer according to some business rules.

The pre-process data can be filtered. For example, an outlier rejection filter can be used to remove data points on a wafer that are outliers and are statistically invalid. In other words, data from sites that are not reliable can be thrown away and not used in the wafer mean calculation.

In one case, a Mean/Sigma comparison method can be used on the pre-process data. For example, (a) a sigma multiplier, X can be specified; (b) all data points can be summarized into a mean and a sigma; (c) two limits can be calculated (Mean+X times sigma and Mean−X times sigma); (d) all data points outside the limits can be removed; (e) the Mean can be recalculated and can represent the final IM measurement. Alternately, the outliers can be identified using a box and whisker plot methodology.

Also, the desired process result for the substrate can be used to establish a desired state for the substrate. One or more desired output parameter(s) can be provided that can be used to determine a desired state for a substrate. For example, the desired process result for the substrate can comprise at least one of a target critical dimension (CD), a target CD profile, a CD uniformity value, and a CD profile uniformity value, among others.

For example, the control position identification between to-be-controlled process parameter and target process parameter must be consistent. Because the to-be-controlled process parameter is defined by the to-be-controlled process chamber, the target process parameter can also defined by the to-be-controlled process chamber. Hence, each target process parameter can be associated with the respective control chamber, and the target process parameter value with which each control chamber is associated can be specified before the lot start.

Also, the source of desired process result can be identified in advance. For example, there can be at least two known types of desired process results: externally generated and internally generated. The externally generated desired process results can be provided by the MES through the controller 120. The internally generated desired process results can be provided using calculated values and/or an input from a GUI. Also, business rules can be provided that can be used to determine when to use the externally generated desired process results and the internally generated desired process results.

Pre-process data can comprise process result data. Verified process result data can be used to define a process space and to develop new process recipes within the process space. A Design of Experiments (DOE) methodology can be used to vary one or more process parameters to obtain process result data, and the process result data can be used to develop relationships between process parameter and process results. Single dimensional and multi-dimensional graphs/charts can be developed to illustrate the relationships between process parameters and process results. For example, the controller 120 can comprise a charting component for displaying process results using single and multi-dimensional charts. Controlled processes can be performed and verified process result data can be collected. For example, process result data can include CD data obtained from an SEM, an ODP tool, or other optical measurement system.

A process space can be sub-divided into process regimes in which one or more process parameters are substantially constant. In one embodiment, process parameters that are substantially constant can be included in a static recipe. Alternately, process parameters that are substantially constant can be included in a formula model. A formula model can be single or multi-dimensional.

In task 430, a required process result can be determined. The required process result can comprise the difference between the desired process result and the actual measured data. Desired process result data, such as target data, can be compared to measured data. For example, the desired process result can comprise at least one of a desired trench area, a desired material thickness, a desired sidewall angle, a desired grating thickness, a desired cross sectional area, a desired CD width, a desired CD depth, a desired feature profile, a desired trim amount, a desired differential depth, a desired uniformity, and a desired differential width.

Figure 5A:
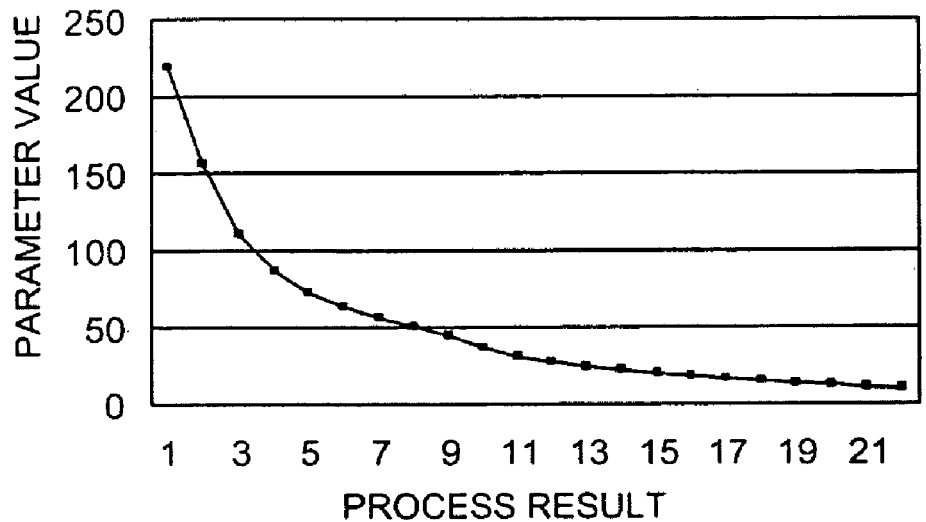
FIGS. 5A and 5B show exemplary graphs of process spaces in accordance with an embodiment of the invention.
Figure 5B:
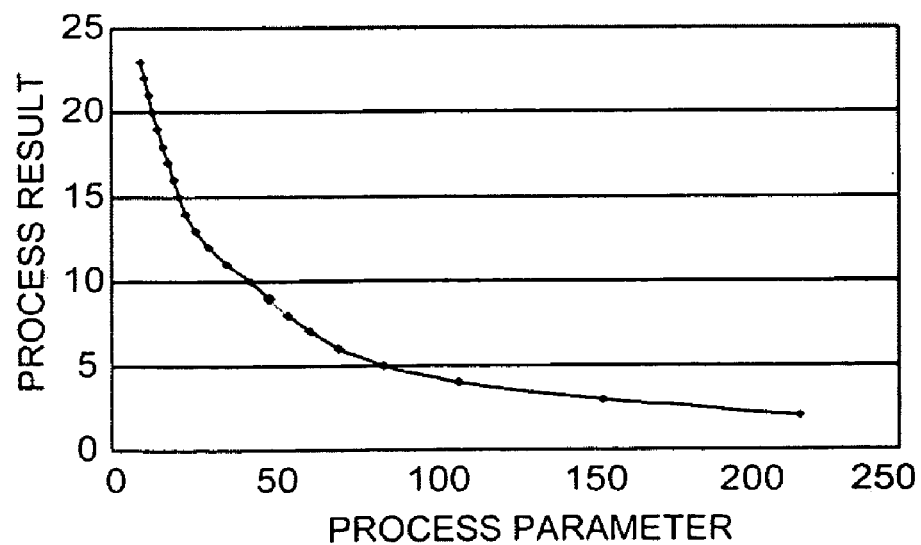

FIGS. 5A and 5B show exemplary graphs of process spaces in accordance with an embodiment of the invention. In the illustrated embodiment shown in FIG. 5A, the graph illustrates a process parameter as a function of a process result. In the illustrated embodiment shown in FIG. 5B, the graph illustrates a process result as a function of a process parameter. Single curves are shown, but this is not required for the invention. Alternately, a number of curves can be used, and the process space can be divided into regions. The process spaces shown are two-dimensional spaces. As would be appreciated by those skilled in the art, however, the process spaces may be three-dimensional. In further alternate embodiments, N-dimensional spaces can be used.

Measured and/or predicted data can be used to develop relationships between process parameters and process results in a process space. For example, Design of Experiments (DOE) data can be used. Equations such as those shown in FIGS. 5A and 5B can be used to create formula models.

For a material removal process, such as an etch or a trim process, when the measured data is less than the desired process result data, an error can be declared. When the desired process result data is approximately equal to the measured data, a "null" condition can be declared. When the desired process result data is greater than the measured data, a required process result can be established. The required process result can comprise a trim or etch amount that needs to be removed during a material removal process.

For a material addition process, such as a deposition process, when the measured data is greater than the desired process result data, an error can be declared. When the desired process result data is approximately equal to the measured data, a "null" condition can be declared. When the desired process result data is less than the measured data, a required process result can be established. The required process result can comprise a deposition amount that needs to be added during a material addition process.

Figure 6:
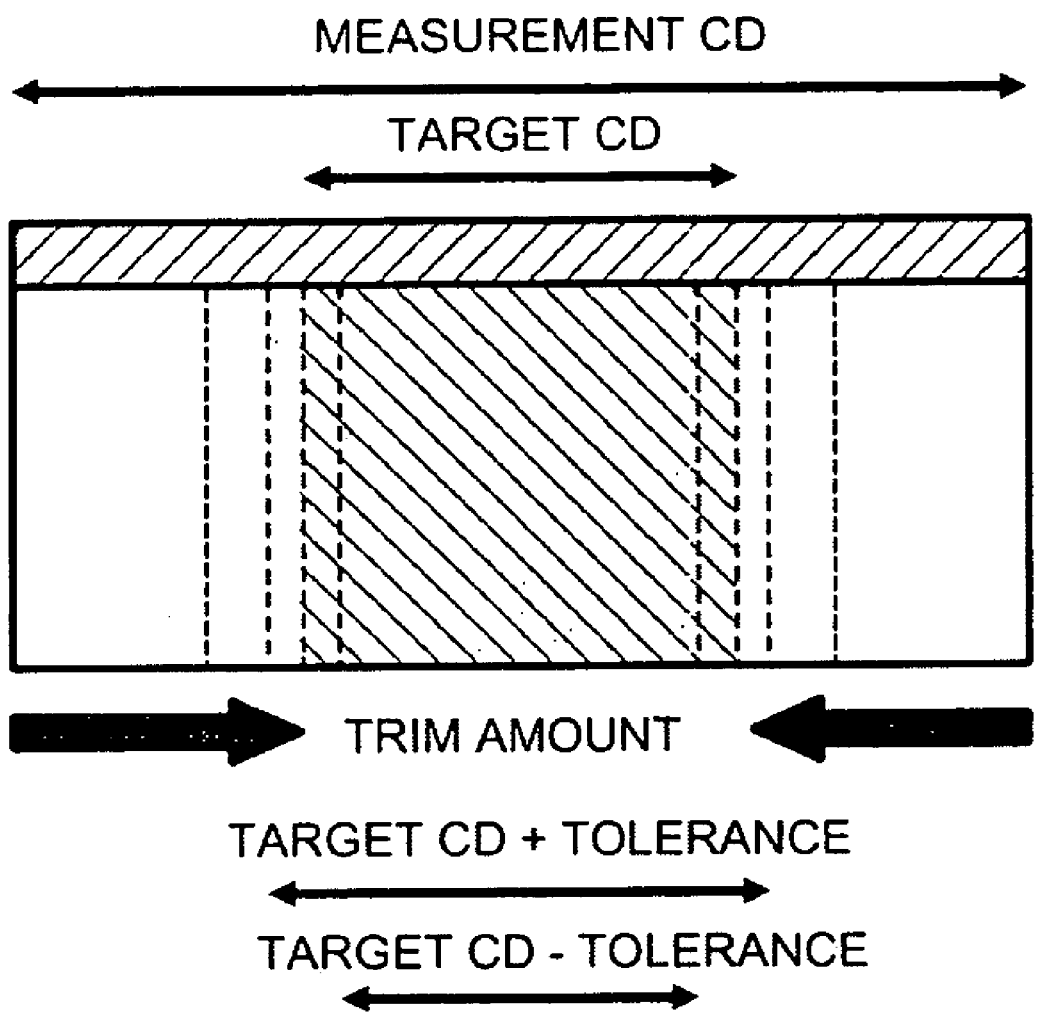
FIG. 6 illustrates an exemplary trimming process in accordance with an embodiment of the invention.

FIG. 6 illustrates an exemplary trimming process in accordance with an embodiment of the invention. In the illustrated embodiment, the processing system can be used to perform a trimming process, such as a CD Control process. For example, one process can comprise determining a trim amount, which can be the difference between the measurement CD and the target CD. In addition, there can be tolerances established around the target CD. In the case of trim (as opposed to vertical etch), the trimming occurs on both surfaces on the structure at the same time. Because of this, the trim amount is twice the amount on a blanket wafer.

As shown in FIG. 6, the invention can be used to control the trimming amount for the specified control CD and to reach the target CD within tolerance. For example, the controllers (TL and R2R) can use an algorithm (a Control Recipe selection method) based on trim etch amount. First of all, the control recipes containing the information on the amount to be trimmed must be evaluated and pre-qualified.

Figure 7:
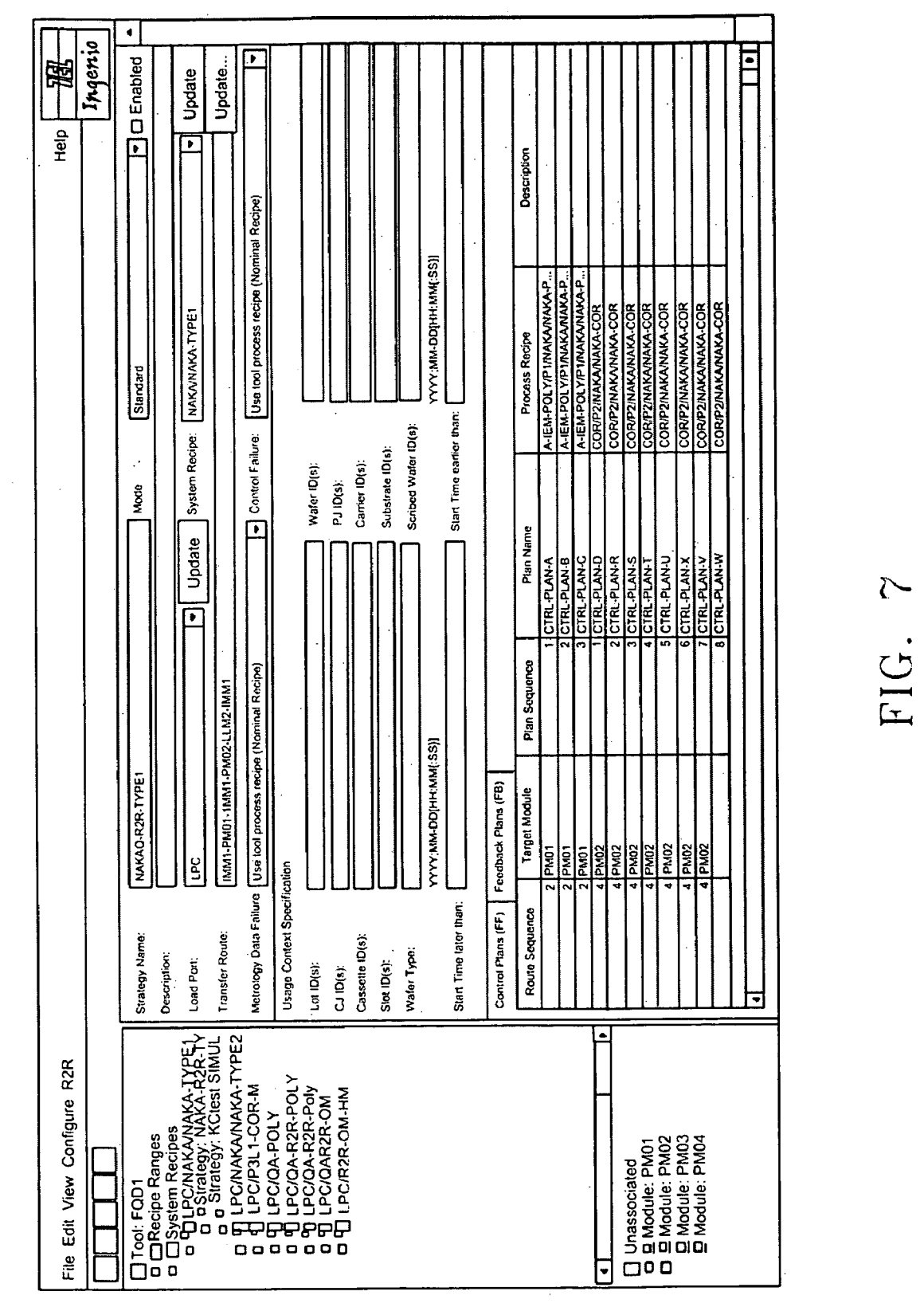

FIG. 7 illustrates an exemplary view of a configuration screen in accordance with an embodiment of the invention. In the illustrated embodiment, a configuration screen is shown that comprises a navigation tree that includes at least one tool level, at least one recipe range level, at least one system recipe level, at least one process module level, at least one strategies level, and at least one plan level. A tool level is shown as the top level, but this is not required for the invention. Alternately, systems and/or subsystems can be shown.

For example, when a recipe range folder is opened, a module and the available recipe ranges for that module can be selected. In addition, when a system recipe folder is opened, the associated control strategies and associated control plans can be created, edited, or deleted.

In the system shown in FIG. 1, feed forward and/or feedback control can be implemented by configuring Control Strategies, Control Plans, and Control Models. A Control Strategy can be written for each system recipe where feed-forward and/or feed-back control is implemented. When a strategy is protected, all of its child objects (plans and models) cannot be edited. When a system recipe executes, one or more of the Control Plans within the Control Strategy can be executed. Each control plan can be used to modify the recipe based on feed-forward and/or feed-back information.

Within the control plan, input parameters and feed-back variables can be specified. In addition, these inputs can be used to specify a calculation for the target calculation. The result of this calculation can be used to choose which control model to execute. The control models can comprise at least one of a static recipe (a fixed recipe for the entire target calculation range) and a formula model (a model that allows the value of process recipe parameters to vary based on an exact calculation). Modifications to the process recipe can be made using the results of one or more static recipes and/or the results of one or more formula models. The system can start with a nominal recipe (the recipe as it exists on the tool) then the updates from each executed Control Plan can be added. Once all the Control Plans are executed (within the matching Control Strategy), the final recipe is sent to the tool. The final recipe can comprise a Nominal Recipe component, a Static Recipe component, and a Formula Model component. Alternately, a different set of components can be used. For example, a baseline recipe and/or null recipe can be used.

FIG. 8 illustrates an exemplary view of an editor screen in accordance with an embodiment of the invention. In the illustrated embodiment, a R2R Recipe Range Editor screen is shown that comprises a table of process parameters and a set of allowable ranges for each parameter. At installation, a default recipe range may be created on each module spanning the entire operating range for each parameter that can be manipulated by the system controller 120. New recipe ranges can then be created for each module with limits stricter than the default ranges. In addition, in the recipe range, a user can disable certain parameters from being manipulated by the controller 120. As formula models and static recipes are created, they are linked to recipe ranges for the set of available parameters for control and limits on those parameters. If a static recipe and/or formula model attempts to set a value outside the associated recipe range, then an alarm can be generated.

FIG. 9 illustrates an exemplary view of a Control Strategy Editor screen in accordance with an embodiment of the invention. The control strategy contains the system recipe to be matched and other context matching criteria. The context information is used to determine which wafer uses a control strategy. The control strategy also contains several independent control plans that contain the information necessary to select the control model(s) to be executed. A Control Strategy Editor screen enables users to download system recipe with control chamber flags or manually input the system recipe name with transfer route. Also, users can optionally create some context matching criteria.

Control strategies can comprise standard control strategies and simulation control strategies. The standard control strategies can be configured to control the process tool 110. A simulation control strategy can be associated with simulation control plan(s). Based on the model selected, the control plan will tune the recipe variables. The recipe variables can be logged by the controller but not sent to process tool. Multiple simulation control strategies can be executed simultaneously, but only one standard type of control plan will be executed for a given wafer. A standard control strategy can be moved from the standard folder to a simulation folder. A simulation control strategy can be moved to a standard folder only if the corresponding system recipe has been downloaded from the tool 110.

Using a Control Strategy Editor screen, such as shown in FIG. 9, a user can perform among other functions, a Control Strategy configuration, view an existing Control Strategy, create a new Control Strategy, copy an existing Control Strategy, edit an existing Control Strategy, and/or delete an existing Control Strategy. If an object is selected and a new child type is created, the child can be associated with the parent. For example, if a control strategy is selected and a new control plan is created, the control plan can be associated with the control strategy.

A Control Strategy Editor screen can comprise a number of fields. A Strategy Name field can be used to enter/edit the name of the strategy. A Mode field can be used to enter/edit the mode for the strategy: Standard—communicates with the tool 110 to perform run-to-run software functions; and Simulation—does not communicate with the tool 10 but emulates standard functions. In the context of the invention, the "Enabled" feature is automatically selected. The check can be removed to disable the Control Strategy by clicking, with a mouse, after positioning a cursor over the checked box.

The Description field can be used to enter/edit a brief description for the new strategy. The Load Port field can be used to enter/edit a load port. After selecting a load port, the System Recipe options become available. The selected Load Port should have at least one configured system recipe. The System Recipe field can be used to enter/edit a system recipe, and the Transfer Route field may be automatically filled in once the system recipe is selected. The Update Load Port Update button can be used to enter/edit the available load ports. The System Recipe Update button can be used to enter/edit/download from the processing tool (Telius) the available System Recipes for the selected load port and update the drop down selections.

The Metrology Data Failure field can be used to enter/edit the metrology data failure action from among the following options: (a) Use Tool Process Recipe (Nominal Recipe)—the software sends the indication to the process tool and the process tool uses the tool process recipe; (b) Do Not Use Process Recipe (Null Recipe)—the software sends the null recipe information associated with the wafer to the process tool and the wafer goes in and out of the chamber without being processed; (c) PM Pause—pauses the process module and (d) System Pause—pauses the system including transfer system. Other options should be apparent to those skilled in the art The Control Failure field can be used to enter/edit the Control Failure option from the following options, among others: (a) Use Tool Process Recipe (Nominal Recipe)—the software sends the indication to the process tool and the process tool uses the tool process recipe; (b) Do Not Use Process Recipe (Null Recipe)—the software sends the null recipe information associated with the wafer to the process tool and the wafer goes in and out of the chamber without being processed; (c) PM Pause—pauses the process module; and (d) System Pause—pauses the system including transfer system.

In addition, other fields may be manipulated. For example, the LotID(s) field can be used to enter/edit the lot identifiers; the CJID(s) field can be used to enter/edit the control job identifiers. The PJID(s) field can be used to enter/edit the process job identifiers. The Cassette ID(s) field can be used to enter/edit the cassette identifiers. The Carrier ID(s) field can be used to enter/edit the carrier identifiers. The Slot(s) field can be used to enter/edit the slot numbers. The Wafer Type(s) field can be used to enter/edit the wafer types. The Scribed Wafer ID(s) field can be used to enter/edit the scribed wafer identifiers. The Substrate ID(s) field can be used to enter/edit the substrate identifiers. The Wafer ID(s) field can be used to enter/edit the wafer identifiers. The Start Time earlier than field can be used to enter/edit the start time. In addition, the Start Time later than field can be used to enter/edit the end time.

As shown in FIG. 9, the Control Strategy comprises a control plan for static recipes and a control plan for formula models. Furthermore, the Control (feed-forward) Plans tab and the Feed-Back Plans tab can be used to create a new control plan, associate a control plan with a Control Strategy, and edit a control plan.

FIG. 10 illustrates an exemplary view of Control Plan Editor Screen in accordance with an embodiment of the invention. In FIG. 10, a Control Plan Editor screen is shown for a control plan for managing a set of formula models for a COR process. Alternately, other processes can be used.

To create a Control Plan, a user can select the plan name item and select a new Control Plan or an existing plan or model. For example, on the Control Strategy Editor screen, a drop-down menu can appear and the Add Plan selection can be chosen.

A Control Plan Editor screen can comprise a number of fields. The Plan Name field can be used to enter/edit a name for the control plan. The Module field can be used to enter/edit a module name. For example, if the plan is associated with a strategy, the Module field may be automatically filled in. If the plan is unassociated, the Module field can be used to select a process module. The Recipe field can be used to enter/edit a recipe. For example, if the plan is associated with a strategy, the Recipe field may be automatically filled in. If the plan is unassociated, the field can be used to select a recipe.

The Description field can be used to enter/edit a description for the plan. The Updated field displays the last time the plan was changed.

The Data Sources table can be used to enter/edit a data source. For example, a R2R Plan Data Source screen may be opened. Using the Data Sources table, drop down menus can be used to open a R2R Data Source screen (FIGS. 11A and 11B).

Figure 11A:
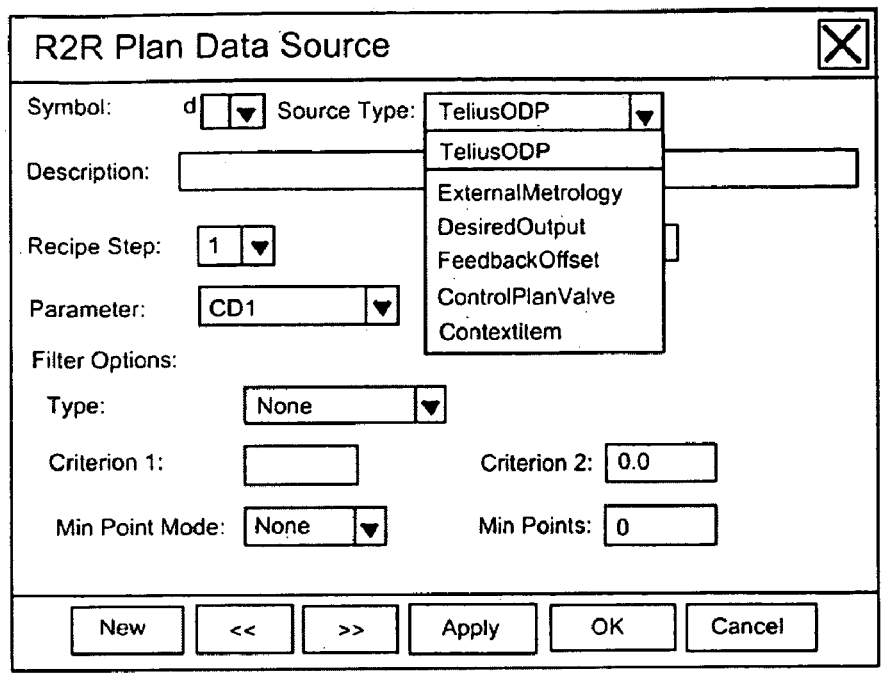
FIGS. 11A and 11B illustrate exemplary views of Data Source screens in accordance with an embodiment of the invention.
Figure 11B:
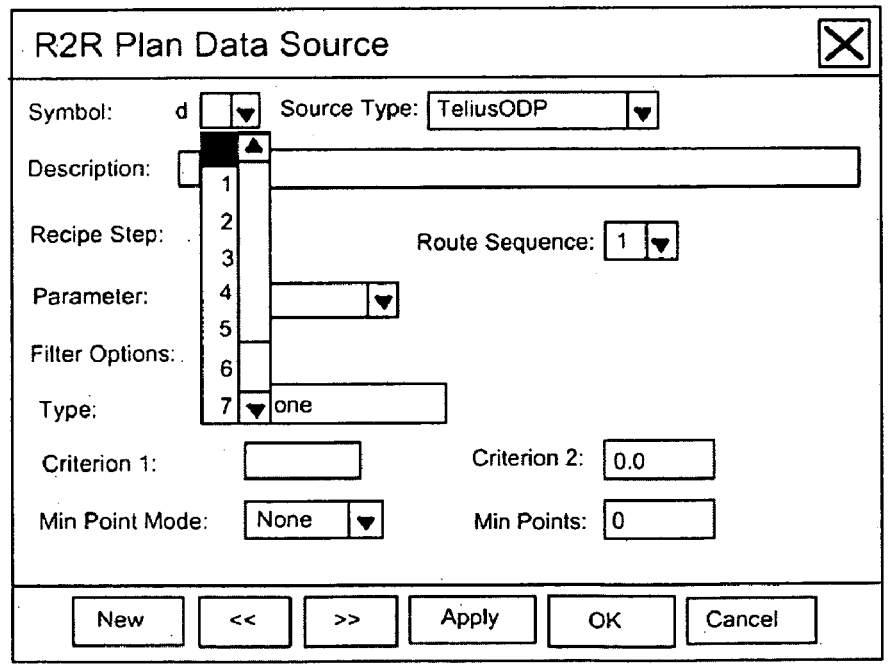

FIGS. 11A and 11B illustrate exemplary views of Data Source screens in accordance with an embodiment of the invention. Among other things, a Data Sources Screen can be used to: (a) select a symbol for the new data source; (b) select a source type; and (c) select a Data Source Description. For example, the selected source type determines the options displayed on the Data Source screen. A "Telius ODP" type can be used to define integrated metrology module data sources that are part of the processing tool. A "Desired Output" type allows the user to enter a fixed unit for the controller A "Feed-back Offset" type allows the user to define a persistent feedback variable. A "Control Plan Value" allows the user to create a variable that references the results of a different control plan (creates nested plans). Next, while not shown in FIG. 11A, the "Integrated Metrology Site Filtering" type creates tables with descriptions of each option when each data source is selected. Other sources may also be provided, as illustrated.

As illustrated in FIG. 11B, the symbol can be selected from the Symbol drop-down list, and a source type can be selected from the Data Source Type drop-down menu. For example, the data source information fields can vary depending on the chosen data source. As should be known to those skilled in the art, "Apply" and/or "OK" selection items can be used to close the screen.

In the target calculation field, on the R2R Control Plan Editor screen shown in FIG. 10, the target calculation can be entered. For example, an equation can be entered that correlates CD-SEM data with ODP data. In addition, the equation can comprise an additional compensation term. For example, the additional compensation factor can be used to correct for errors introduced in another step, such as a gate stack etch step.

For example, as also shown in FIG. 10, the new target value can be a variable that is calculated at or before run time, and an equation can be used to calculate the target value. In addition, new lower and upper limit values can be used, and these values can be entered in the lower limit field and upper limit field. For example, the new lower and upper limit values can be constants or variables that are calculated at or before run time, and equations can be used to calculate the new lower and upper limit values.

The Model Selections field, illustrated in FIG. 10, can be used to create a new model or select an existing Static or Formula model. For example, under the model type selection item, a selection item in the table can be used to enter and/or edit a model type. For example, a drop down list can be activated from the table item and a selection can be made from the drop down list. One option in the drop down list allows a new model to be created; other options can be used to display and select existing models to use or to modify. Each model type can have a module name, target value, lower limit, upper limit, and recipe output associated with it, among other options. When creating a new model, a new model type can be used and entered in the model type field, and a new model name can be used and entered in the model name field.

The Predicted Result Calculation field can be used to enter a new predicted result value or select an existing predicted result value. The predicted result value can be an equation for the expected result. For the R2R Control Plan Editor shown in FIG. 10, it is contemplated that a Control Plan can be saved when Name, Target Calculation, and Model Selection information is entered.

It is also contemplated that an Associate Control Plan Screen (not shown) may be included as a part of the invention. An Associate Control Plan Screen can be used, inter alia, to: (a) select the target module with which to associate the selected control plan; (b) display the selected control plan; (c) open a R2R Control Plan Editor screen; (d) open the selected control plan; (e) create a new control plan with the same configuration as the selected control plan; (f) associate the selected control plan with the target module; and (g) close the Associate Control Plan screen. The # field in the R2R Control Plan Editor shown in FIG. 10, comprises a number of the model in the list of models. The model type allows either a Static or a Formula model to be selected. The Model Name field lists the names of available models. For example, to create a new model, a "New Static Recipe" option or a "New Formula Recipe" option can be selected from a drop down list. A static control plan can be created that comprises one or more static recipes.

Figure 12:
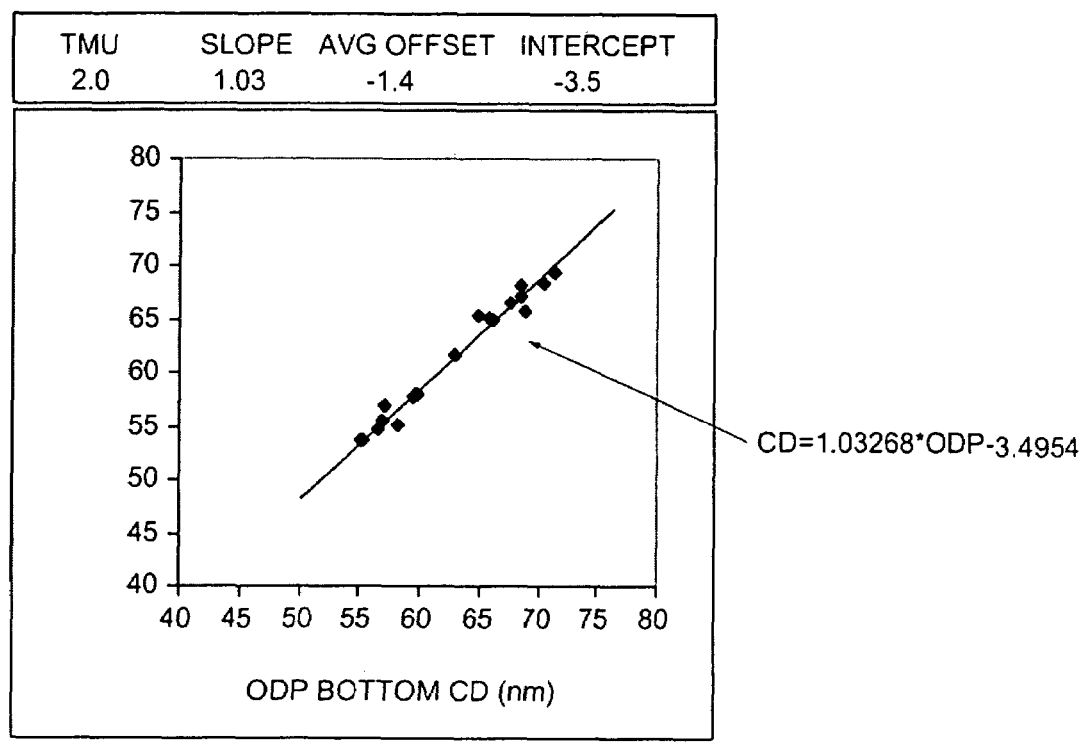
FIG. 12 illustrates a graph of an exemplary process in accordance with an embodiment of the invention.

In addition, the Target calculation can be an equation that relates a desired output, such as a bottom CD measurement, to measured data, such as a CD measurement from an SEM (Scanning Electron Microscope). An exemplary relationship is shown in FIG. 12. The three input data sources are shown with different symbols (d1, o1, and o2). Naturally the invention is not limited solely to these three input data sources A different number of input data sources can be used, and each input data source can have a different symbol value. For example, one data source can be an ODP tool, and it can be part of the processing tool, such as a Telius. In addition, another data source can be a SEM, and the ParameterNalue can be actual measured data such as a CD-SEM data.

As shown in FIG. 10, a control plan can be created that comprises one or more formula models. For example, ten formula models are shown. The ten formula models are shown with the same target value (t1), but this is not required. A different number of formula models can be used, and each formula model can have a different target value. As shown in FIG. 10, the ten formula models can have different operating ranges as defined by the lower limit values and the upper limit values.

Returning to procedure 400 (FIG. 4), a nominal recipe may be determined in task 440. Process recipes, such as a nominal recipe, can be obtained from the processing tool 110, the controller 120, or a recipe library. A nominal recipe can be the process recipe that is included in the system configuration for a controlled process module.

In one embodiment, the system starts with the Nominal Recipe (the recipe as it exists on the tool 110) then the updates from each executed Control Plan are added. Alternately, a nominal recipe is not required. Once all the Control Plans are executed (within the matching Control Strategy), the final recipe is sent to the tool 110. The Nominal Recipe can be a process recipe that is included in the system recipe for the controlled process module. A nominal recipe can be a baseline or default recipe. The control actions performed by the controller 120 can overwrite selected process parameters to specify deviations from a nominal recipe. A nominal recipe can be obtained from a MES.

In addition, a null recipe can also be used. A null recipe can be a control recipe that is used by a processing tool and/or processing system to allow a substrate to pass through a processing chamber without processing. For example, a null recipe can be used when a processing tool is paused or when a substrate does not require processing.

During configuration, a system recipe, such as a nominal recipe, can be downloaded to the controller 120 before R2R control can be configured. For example, the system recipe can be downloaded from a processing tool or from a MES. Also, a metrology data source can be selected. The selection of the controlled process module can be based on the selected processing tool system recipe.

Prior to lot start, a processing tool 110 can send a request for system recipe verification to the controller. This event triggers verification of the R2R control strategy and it its associated control plans. Next, the controller 120 sends system recipe information, downloaded during configuration, back to the processing tool 110 to verify its consistency before R2R control begins. When all of the system recipes that are referenced by the control plans in the matching control strategy have been verified, the controller 120 sends a message to the processing tool 110 indicating that the system recipe verification was successful.

If the system recipe is verified, the lot can start with R2R control. If it is not verified, the lot cannot start with R2R control.

During the runtime after lot start, metrology data can be sent from the processing tool 110 to controller 120. For example, data can be sent after each wafer is measured using the integrated metrology module.

Based on the control plan configured on the controller 120, the controller 120 calculates the optimal control variables according to the metrology data, target CD, and the control model. The controller 120 checks to see if the calculated parameters are inside the process recipe constraints. If they are, then the controller 120 sends the calculated recipe parameters to the processing tool 110. The calculated recipe parameters overwrite the default values found in the nominal process recipe in the processing tool 110.

Finally, as each wafer arrives at the controlled process module, the processing tool 110 processes each wafer using the parameters in the modified process recipe.

In task 450, a new process recipe can be created, where the new process recipe is the recipe to be used to obtain the required process result. The new process recipe can comprise one or more processes each comprising one or more processing steps. The new process recipe can be performed in a single chamber or in multiple chambers. The new process recipe can be configured using at least one of a nominal recipe, a static recipe, and a formula model.

A static recipe can be a single set of recipe adjustments that are used to achieve a specific desired process result, and the desired process result is not used to calculate the recipe parameters. A set of static recipes can be used to set up a table-based controller, or static recipes can be used along with formula models to treat ranges of the desired output where the same recipe should be used. When using feedback with static recipes, a single predicted process result can be specified in the control plan for each static recipe used. GUI screens can be used to create and/or edit static recipes.

A formula model can comprise, among other parameters, a pre-model adjustment, a model equation, a series of post model adjustments, and a recipe parameter assignment map. The pre-model adjustment can allow the re-expression of the desired process result (usually t1) into the correct units that are used in a model equation (resulting in a value of y), and the model equation can be an expression that calculates the predicted process result as a function of one manipulated variable (x). When the model is executed it will solve for x given the re-expressed desired process result (y). Once x is determined, the post model adjustments can be calculated, and their values will be assigned to the appropriate recipe parameters specified in the recipe parameter map.

In addition, one or more process models can be provided. A process model can be used to define a process space. A process model represents the verified relationship between the desired results (outputs) and the received variables needed to achieve those results. Process models can include equations that can include formula-based models. Formula-based models can comprise equations that contain the piecewise associations of desired results with recipe variables based on some evaluated experimental data. A process model can be linear or non-linear. A process model can be used to verify a new process recipe, and update an existing process recipe.

A formula model can be used to control a dynamic process, such as a trimming process. Alternately, a formula model can be used to control a different process. An exemplary set of equations relating a process parameter and a process result are shown in FIGS. 5A and 5B.

FIG. 13 illustrates an exemplary view of a R2R Formula Model Editor screen in accordance with an embodiment of the invention. In the illustrated embodiment, one formula model "Trim6__1to6__7" is shown. Alternately, different models and/or recipes can be shown.

A R2R Formula Recipe Editor screen can comprise a Name field for entering and/or editing a name for a formula recipe, a Recipe Range field for selecting a recipe range or creating a new recipe range, an Edit Range selection item for opening a R2R Recipe Range Editor screen (FIG. 8), and a Description field for entering and/or editing a description for the new formula recipe. Other fields also may be provided.

In FIG. 13, the Name field comprises "Trim6__1to6__7" which is the name for this exemplary formula model. The Recipe Range field comprises "COR" which can be related to a particular process such as a COR process, and the Description field can comprise "COR Trim (14 mT)" which can a sufficient description describing the FMA formula recipe. The Pre-Model Adjustment field comprises the variable (t1) which means that no additional pre-model adjustment is required. The "Valid y after adjustment" fields can comprise "6.1" and "6.7", and these can be used to restrict the operating range to 6.1-6.7. For example, the pre-model adjust variable (y) value can represent a trim amount measured in nanometers. When the pre-model adjust variable (y) value falls outside of this range, an alarm can occur because this model failed.

A Model Equation field can be used for entering and/or editing the model equation in terms of x. For example, y can be a function of a single variable x. Alternately, y can be a function of several variables. A "Valid equation solution x" field can be used to enter a valid range for x. When the x value falls outside of this range, an alarm will occur because this model failed.

In FIG. 13, the Model Equation field comprises a third order polynomial, but this is not required for the invention. Alternately, other polynomials can be used for the model equation. For example, the model equation dependent variable (y) value can represent a trim amount, and the model equation independent variable (x) value can represent a flow rate for a process gas. The "Valid equation solution x" fields can be used to enter a valid range for the flow rate for a process gas. When the x value falls outside of this range, an alarm can occur because this model failed.

For an exemplary process, a number of process control objects can be defined such as a Nominal recipe, a Static recipe A, a Static recipe B, a Formula model A, a Formula model B1, and a Formula model B2. Alternately, the number and types of process control objects can be different from those listed herein.

One or more equations can be created to model the process space, such as the process spaces shown in FIGS. 5A and 5B. In one embodiment, Model Equations (y=f(x)), such as those shown on Formula Model Editor Screen (FIG. 13) can be used. In one case, y can be equal to a desired process result, such as "Trim Amount" (TA), and x can be equal to a process parameter (Control Variable) that has been related to y. For example, from set of measured data for a process recipe (Recipe A) that relates a trim amount range (6.1≦y≦6.7) to a process parameter, such as a gas flow rate x; determine a process recipe (Recipe A) equation y=f(x); and determine an inverse process recipe (Inverse Recipe A) equation x=f(y).

In the process space, one or more model equations can be determined by creating a polynomial and finding the coefficients of the polynomial which relates a process gas flow rate to a trim amount in a first part of the process space, where the trim amount (TA) varies between 6.1 nm and 6.7 nm and the flow rate (Ar) varies between approximately 60.0 sccm and approximately 71.0 sccm. For example, an $N^{th}$ order polynomial can be used $$TA = \sum_{0}^{N} A_n (AR)^n$$

where AR is a dynamic variable, trim amount (TA) is a required process result, N>=1; and $A_n$ can comprise a constant having at least one of a positive value, a negative value, and a zero value. In one embodiment, the $N^{th}$ order polynomial can be solved to determine a value for AR.

Alternately, an inverse equation can be determined by creating a different polynomial and finding the coefficients of the different polynomial which can relate process gas flow rate to a trim amount in a first part of the inverse process space, where the flow rate (AR) varies between approximately 60.0 sccm and approximately 71.0 sccm, and the trim amount (TA) varies between 6.1 nm and 6.7 nm.

For example, an $N^{th}$ order polynomial can be used $$AR = \sum_{0}^{N} C_m (TA)^m$$

where AR is a dynamic variable, trim amount (TA) is a required process result, N>=1, and $C_m$ can comprise a constant having at least one of a positive value, a negative value, and a zero value.

A "Post-Model Adjustment f(x)" table can be used to create a list of terms for this model to manipulate. The terms can be defined by the controller and can be assigned to at least one step related cell in the process table/spreadsheet as shown in FIG. 13. Alternately, a Recipe Parameter Map can be created in which each term is assigned a parameter's value.

As shown in FIG. 13, a "Post-Model Adjustment (x)" table/spreadsheet can comprise a number of variables ($g_n$, $h_n$, and $i_n$) that the model can manipulate. The variables can be defined by equations that can comprise constants and other variables. The other variables can comprise values sent to the R2R controller executing the model. The other variables can be sent by another controller such as a tool level controller, a R2R controller, a system level controller, a client controller, or a factory level controller, among others.

Figure 14A:
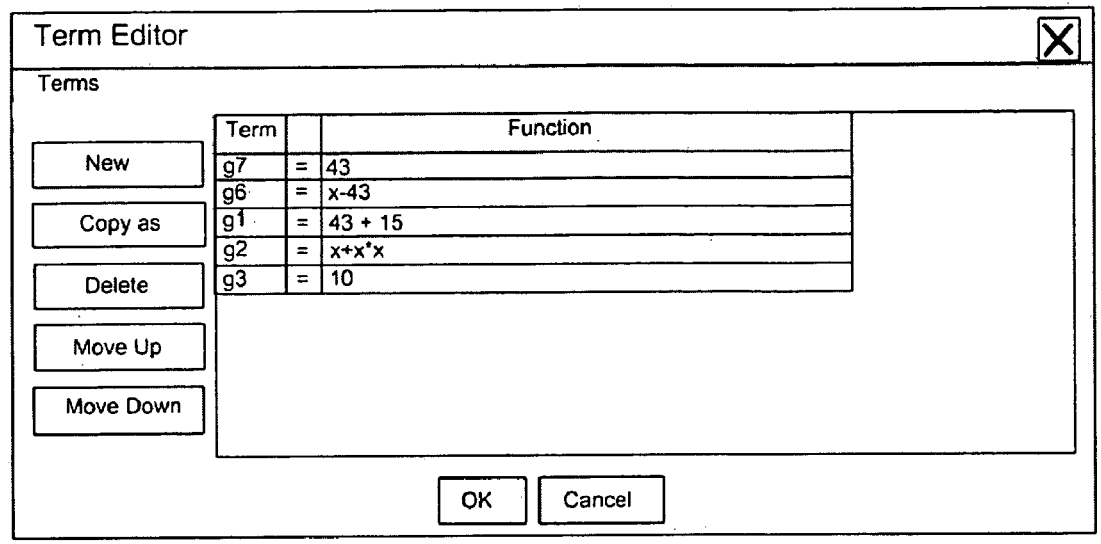
FIG. 14A illustrates an exemplary view of a Term Editor Screen in accordance with an embodiment of the invention.
Figure 14B:
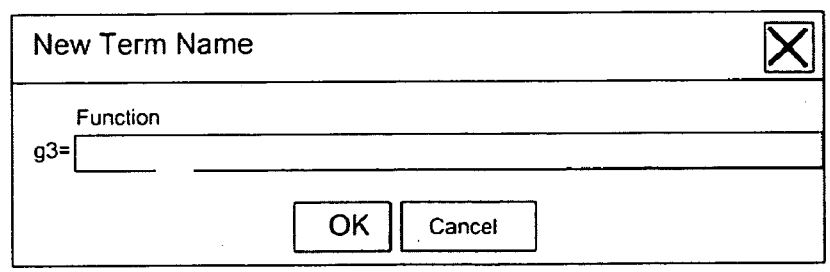
FIG. 14B illustrates an exemplary view of a Term Entry Screen in accordance with an embodiment of the invention.

Drop down lists can be used to edit various fields on the R2R Formula Model Editor screen. For example, a drop-down list can be used to enter and/or change a variable in the table. FIG. 14A illustrates an exemplary view of a Term Editor screen in accordance with an embodiment of the invention, and FIG. 14B illustrates an exemplary view of a New Term Name screen in accordance with an embodiment of the invention.

In the example illustrated in FIG. 14A, g7 can be equal to 43 where x is the dependent 43 is a correction constant that can be used to compensate for a reactant gas flow rate in another process or can be used to enter a constant value that is part of a static recipe. The variable g6 can be equal to (x−43), where x is the dependent variable in the model equation (y=f(x)) and 43 is a correction constant that can be used to compensate for a reactant gas flow rate is another process step or can be used to enter a constant value that is part of a static recipe. The variable g1 can be equal to (80*x/100), where x is the dependent variable in the model equation (y=f(x)). The variable g2 can be equal to (g1+g7) where g1 and g7 are other variables in the table.

Figure 15:
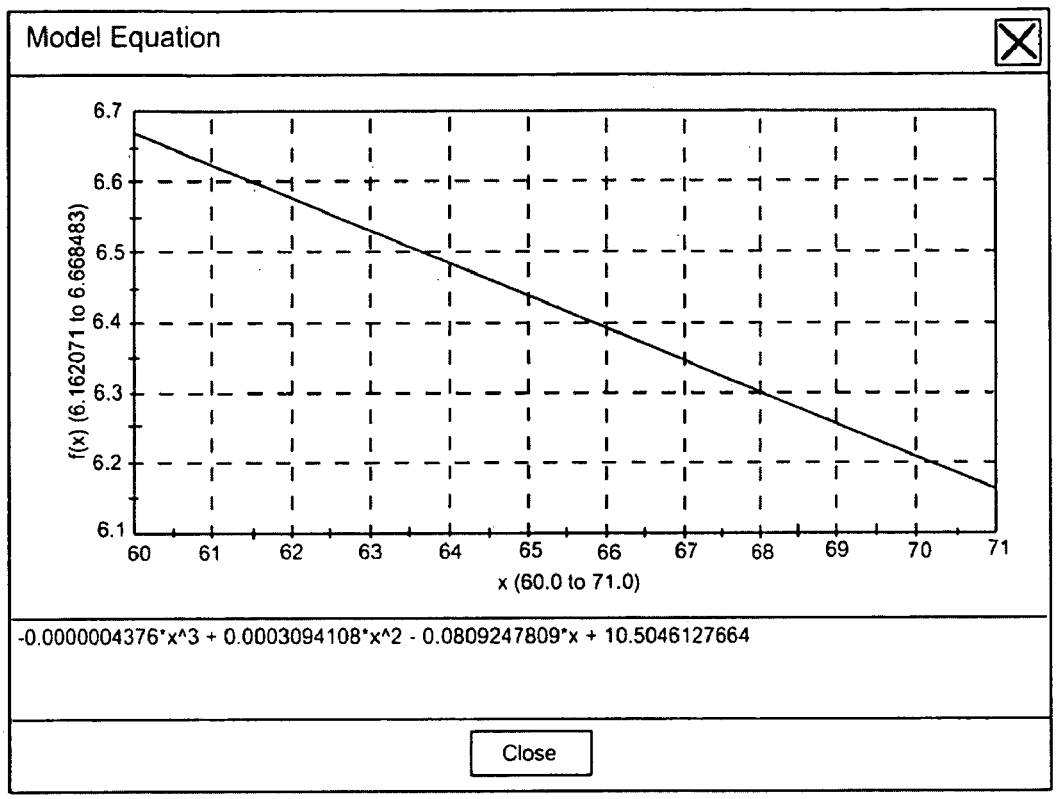
FIG. 15 illustrates an exemplary view of a Model Equation Screen in accordance with an embodiment of the invention.

FIG. 15 illustrates an exemplary view of a Model Equation screen in accordance with an embodiment of the invention. A graph of the model equation is shown for a particular portion of the process space. In the illustrated embodiment, a substantially linear curve is shown, but this is for illustration only. The curve can have a non-linear shape, as would be appreciated by those skilled in the art.

FIG. 16 illustrates an exemplary view of a R2R Static Recipe Editor screen in accordance with an embodiment of the invention. In the illustrated embodiment, one static recipe "SRA_no_HF" is shown. Alternately, different models and/or recipes can be shown.

In the illustrated embodiments, a number of process parameters and a number of process steps are shown, but these are not required for the invention. In alternate embodiments, different process parameters and different process steps can be used.

The Name field comprises "SRA_no_HF", which can be the name of a static recipe. The Recipe Range field comprises "RRafterinstall1" which can be related to a particular process, such as a process performed after installation. The Description field can comprise a description for a static recipe. Constants can be used in formula models to replace values in the static recipes.

FIG. 17 illustrates an exemplary nominal recipe in accordance with an embodiment of the invention. In the illustrated embodiment, a number of process parameters and a number of process steps are shown, but these are not required for the practice of the invention. In alternate embodiments, different process parameters and different process steps can be used.

Figure 18:
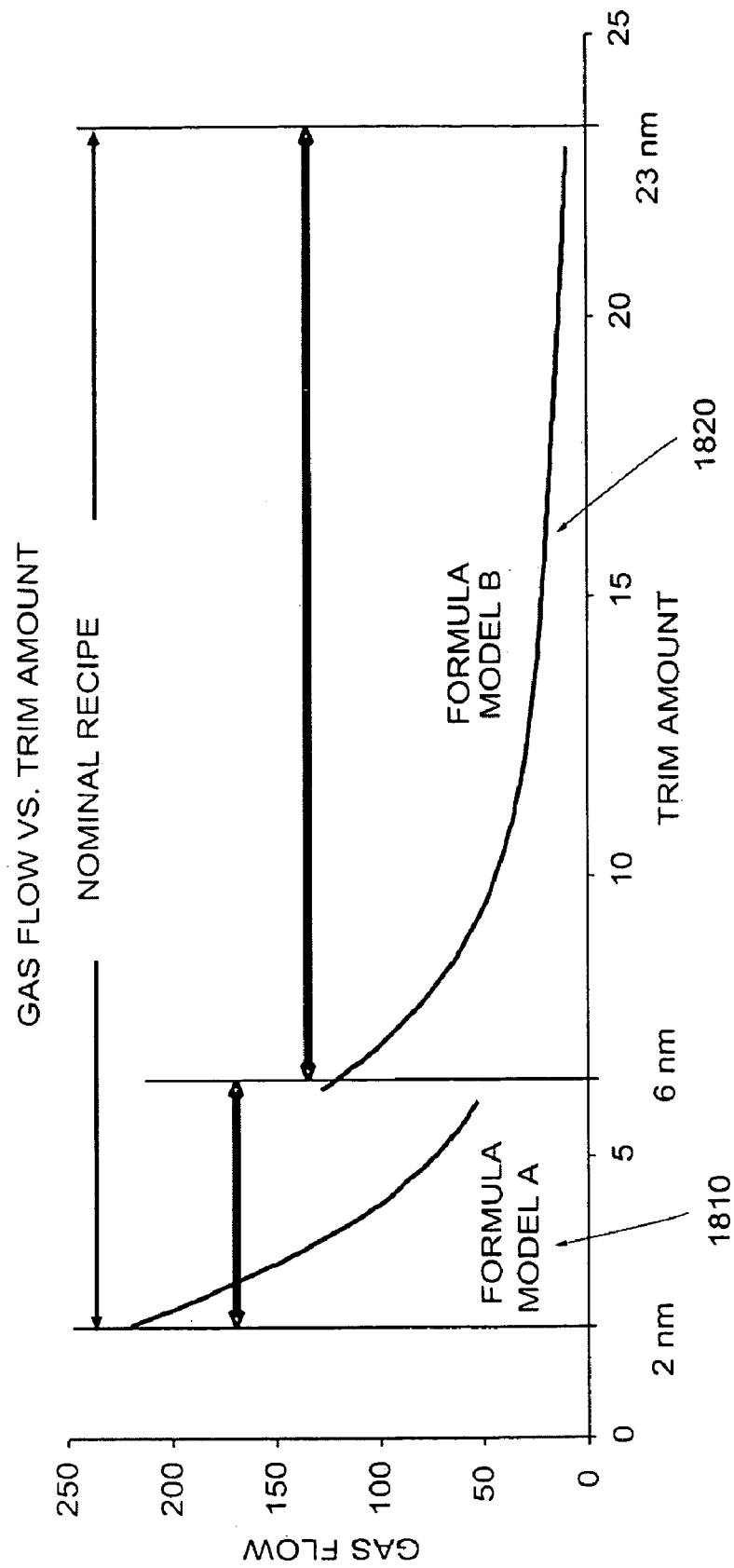
FIG. 18 illustrates a graph of an exemplary process in accordance with an embodiment of the invention.

FIG. 18 illustrates a graph of an exemplary process in accordance with an embodiment of the invention. In the illustrated embodiment, the graph shows gas flow versus trim amount. These parameters are not required for the invention, and other parameters can be used. The illustrated results show that, in many cases, multiple equations in multiple processing regimes are required to cover a large range of process results. Equations can be linear or non-linear.

FIG. 18 also shows the relationship between two different recipes and their process results. The two different recipes can comprise different parameters that can be held substantially constant. For example, in recipe A the chamber pressure is maintained substantially constant at one value (14 mTorr), and in recipe B the chamber pressure is maintained substantially constant at another value (10 mTorr). In other embodiments, a process space can be subdivided because of restrictions dictated by a processing tool, for example, gas flows, can be used to divide a process space, when a processing tool comprises two or more flow controllers.

In FIG. 18, two processing regimes are shown and the process space can be divided into two parts. In a first processing regime 1810, the process result (trim amount) varies from approximately 2 nm to approximately 6 nm; in a second processing regime 1820, the process result (trim amount) varies from approximately 6 nm to approximately 23 nm. In alternate embodiments, there can be a different number of processing regimes, and the limits can be different than the ones illustrated.

In each processing regime, an equation (formula) can be used to calculate the relationship between a process result, such as a trim amount, and a process parameter, such as gas flow. The process recipe can comprise at least one of: a nominal recipe component, a static recipe component, and a formula model component, among others. Alternately, a different number of components and/or different types of components can be used.

As shown in the illustrated embodiment, the process recipe used in the first processing regime 1810 can comprise a nominal recipe component, and a formula model A component. Alternately, a static recipe component (not shown) can also be used. The process recipe used in the second processing regime 1820 can comprise a nominal recipe component, and a formula model B component. Alternately, a static recipe component (not shown) can also be used.

Single variable and multi-variable formula models can be developed to illustrate the relationships between process parameters and process results.

FIG. 19 illustrates an exemplary view of a R2R Formula Model Editor screen in accordance with an embodiment of the invention. In the illustrated embodiment, one formula model is shown. Alternately, different models and/or recipes can be shown, as would be appreciated by those skilled in the art.

A R2R Formula Recipe Editor screen can comprise a Name field for entering and/or editing a name for a formula model, a Recipe Range field for selecting a recipe range or creating a new recipe range, an Edit Range selection item for opening a R2R Recipe Range Editor screen (not shown), and a Description field for entering and/or editing a description for the new formula model.

In FIG. 19, the Name field comprises "COR1", which is the name for the formula model. The Recipe Range field comprises "R2R_test_COR" which can be related to a particular process such as a COR process, and the Description field can comprise a description of the formula model. The Pre-Model Adjustment field comprises the variable (t1) which means that no additional pre-model adjustment is required. The "Valid y after adjustment" fields can comprise "2.0" and "6.0", and these can be used to restrict the operating range to 2-6. For example, the pre-model adjust variable (y) value can represent a trim amount measured in nanometers. When the pre-model adjust variable (y) value falls outside of this range, an alarm can occur because this model failed.

A Model Equation field can be used for entering and/or editing the model equation in terms of x. For example, y can be a function of a single variable x. Alternately, y can be a function of several variables. A "Valid equation solution x" field can be used to enter a valid range for x. When the x value falls outside of this range, an alarm will occur because this model failed.

In FIG. 19, the Model Equation field comprises a third order polynomial, but this is not required for the invention. Alternately, other polynomials can be used for the model equation. For example, the model equation dependent variable (y) value can represent a trim amount, and the model equation independent variable (x) value can represent a flow rate for a process gas. The "Valid equation solution x" fields can be used to enter a valid range for the flow rate for a process gas. When the x value falls outside of this range, an alarm can occur because this model failed.

During the reaction step in a COR process, $NH_3$ and HF form a product on the surface of the wafer. An inert gas, such as Ar, is used to dilute the reactant gases and control the amount etched. A set of experiments have been performed, and the data from the experiments has been analyzed. In order to control the process, the trim amount range can be divided into two pressure regions (FIG. 18).

For an exemplary process, a number of process control objects can be defined such as a Nominal recipe, a Formula model A, and a Formula model B. Alternately, the number and types of process control objects can be different.

One or more equations can be created to model the process space. In one embodiment, Model Equations (y=f(x)), such as those shown on Formula Model Editor Screen (FIG. 19) can be used. In one case, y can be equal to a "Trim Amount" (TA), and x can be equal to a Control Variable that has been related to y. For example, from a Design of Experiments (DOE), obtain a set of measured data for a process recipe that relates a trim amount range (2.0<=y<=6.0) to a process parameter such as a gas flow rate x; determine a recipe equation y=f(x); and determine an inverse recipe equation x=f(y).

In the first process regime (FIG. 18, 1810), the model equation can be determined by creating a polynomial and finding the coefficients of the polynomial which relates a process gas flow rate to a trim amount in a first process regime, where the trim amount (TA) varies between 2 nm and 6 nm and the flow rate (Ar) varies between approximately 60.0 sccm and approximately 70.0 sccm. For example, an $N^{th}$ order polynomial can be used $$TA = \sum_0^N A_n(AR)^n$$

where AR is a dynamic variable, trim amount (TA) is a required process result, N>=1; and $A_n$ can comprise a constant having at least one of a positive value, a negative value, and a zero value. In one embodiment, the $N^{th}$ order polynomial can be solved to determine a value for AR.

Alternately, an inverse equation can be determined by creating a different polynomial and finding the coefficients of the different polynomial which can relate process gas flow rate to a trim amount in a first process regime, where the flow rate (AR) varies between approximately 60.0 sccm and approximately 70.0 sccm, and the trim amount (TA) varies between 2.0 nm and 6.0 nm.

For example, an $N^{th}$ order polynomial can be used $$AR = \sum_0^N C_m(TA)^m$$

where AR is a dynamic variable, trim amount (TA) is a required process result, N>=1, and $C_m$ can comprise a constant having at least one of a positive value, a negative value, and a zero value.

A "Post Model Adjustment (x)" table can be used to create a list of terms for this model to manipulate. A Recipe Parameter Map (not shown) can be created in which each term is assigned a parameter's value.

As shown in FIG. 19, a "Post Model Adjustment (x)" table can comprise variable terms that the model can manipulate.

For example, g5 can be equal to (x−53) where x is the dependent variable in the model equation (y=f(x)) and 53 is a correction constant that can be used to compensate for a reactant gas flow rate is another process step. In addition, g7 can be equal to 15 and can represent a parameter, such as "Gas3", in steps 1 and 2; g8 can represent a parameter, such as "Chamber Pressure", in steps 1-4; and g9 can be equal to (g5+15) and in this manner two variable can be related to each other.

In addition, a number of compensation factors are shown in the table. For example, the compensation factors can be used to compensate for process parameter changes performed in other process objects, such as a static recipe.

An equation solver can be used by the control system when it executes a formula model. A formula model can contain a two-dimensional equation y=f(x), along with a user-specified range of x over which the equation describes the current process.

The LHS of the equation y usually represents the desired output of the process, e.g., Trim Amount. This amount is calculated from wafer readings or other measured data. The equation y=f(x) is determined empirically or from first principles and x represents a recipe parameter, such as gas flow.

For example, an equation solver can be used when a formula model is used to determine the recipe parameters necessary to achieve a desired process output. The following parameters can be passed to the equation solver: a) the equation y=f(x); b) the value of y for the present wafer; and c) a low limit and a high limit for x, which indicate the valid range for the process equation. The equation solver first moves the LHS term y to the RHS of the equation, thus changing it in form to: 0=f(x)−y; Then since the value of y is known, the next step is to determine the solution or root x of the equation using a suitable algorithm such as the Ridders algorithm or method, first described in: Ridders, C. F. J. "A New Algorithm for Computing a Single Root of a Real Continuous Function." IEEE Trans. Circuits Systems 26, 979-980, 1979.

The low and high limits for x are used as starting points, and are therefore required in order for the solver to work properly. The equation solver methodology conceptually separates the process into an output (y) and an input (x). This separation allows for different formula models to be used for different process regions without confusion over the meanings of the terms y and x. It also allows for consistent use of the desired output (y) in subsequent feed-back controllers. The solver is not limited to linear equations. Many processes have non-linear regions. The numerical approach ensures that even complex polynomial equations can be used to describe a process. However, the equation must be continuous over the provided range of x, but discontinuous equations may be split up into multiple formula models.

Figure 20:
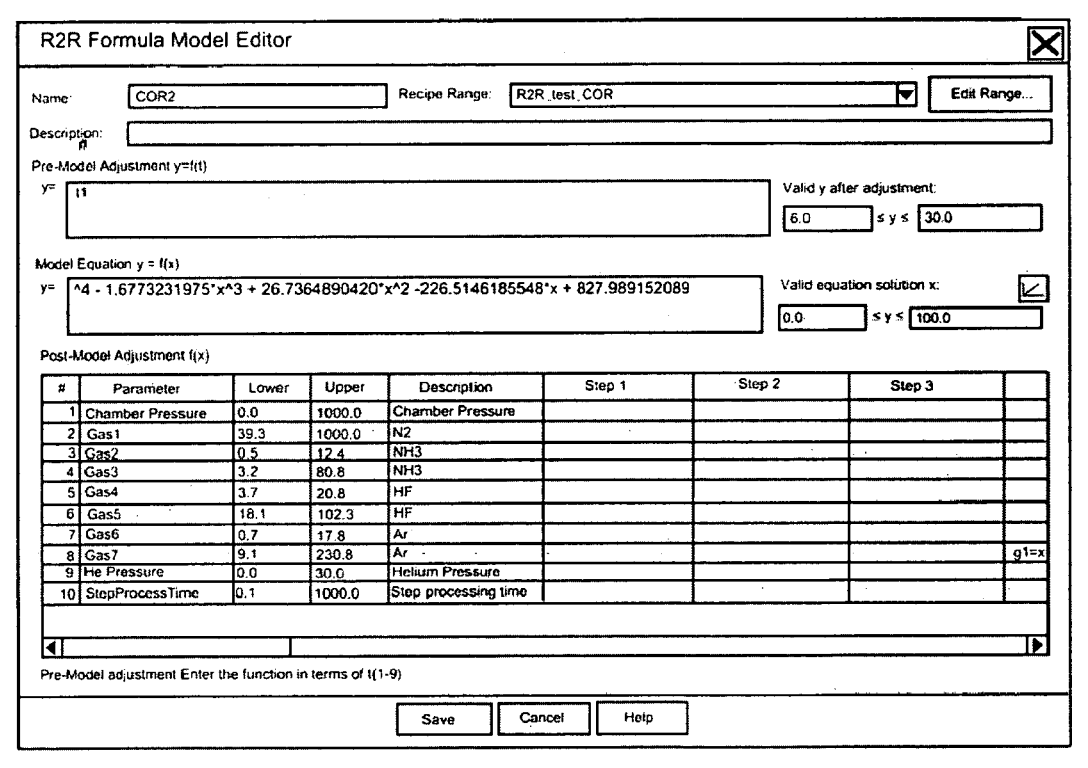

FIG. 20 illustrates an exemplary view of another R2R Formula Model Editor screen in accordance with an embodiment of the invention. In the illustrated embodiment, one formula model "COR2" is shown. Alternately, different models and/or recipes can be shown.

The Name field comprises "COR2", which is the name for the formula model. The Recipe Range field comprises "R2R_test_COR" which can be related to a particular process such as a COR process, and the Description field can comprise a description for describing the "COR2" formula recipe. The Pre-Model Adjustment field comprises the variable (t1) which means that no additional pre-model adjustment is required. The "Valid y after adjustment" fields can comprise "6.0" and "30.0", and these can be used to restrict the operating range to 6-30. For example, the pre-model adjust variable (y) value can represent a trim amount measured in nanometers. When the pre-model adjust variable (y) value falls outside of this range, an alarm can occur because this model failed.

The Model Equation field comprises a third order polynomial, but this is not required for the invention. Alternately, other polynomials can be used for the model equation. For example, the model equation dependent variable (y) value can represent a trim amount, and the model equation independent variable (x) value can represent a flow rate for a process gas. The "Valid equation solution x" fields can be used to enter a valid range for the flow rate for a process gas. When the x value falls outside of this range, an alarm can occur because this model failed.

One or more equations can be created to model the process space. In one embodiment, Model Equations (y=f(x)), such as those shown on Formula Model Editor Screen (FIG. 20) can be used. In one case, y can be equal to a "Trim Amount" (TA), and x can be equal to a Control Variable that has been related to y. For example, from a Design of Experiments (DOE), obtain a set of measured data for a process recipe that relates a trim amount range (6.0<=y<=30.0) to a process parameter such as a gas flow rate x; determine a recipe equation y=f(x); and determine an inverse recipe equation x=f(y).

In the first part of the second process regime (FIG. 18 (1820)), the model equation can be determined by creating a polynomial and finding the coefficients of the polynomial which relates trim amount to a process gas flow rate in a second process regime, where the trim amount (TA) varies between 6.0 nm and 30.0 nm and the flow rate (AR) varies between approximately 0.0 sccm and approximately 100.0 sccm.

For example, an $N^{th}$ order polynomial can be used $$TA = \sum_{0}^{N} A_n (AR)^n$$

where AR is a dynamic variable, trim amount (TA) is a required process result, N>=1; and $A_n$ can comprise a constant having at least one of a positive value, a negative value, and a zero value. In one embodiment, the $N^{th}$ order polynomial can be solved to determine a value for AR.

Alternately, an inverse equation can be determined by creating a different polynomial and finding the coefficients of the different polynomial which can relate process gas flow rate to a trim amount in a second process regime, where the flow rate (AR) varies between approximately 0.0 sccm and approximately 100.0 sccm, and the trim amount (TA) varies between 6.0 nm and 30.0 nm.

For example, an $N^{th}$ order polynomial can be used $$AR = \sum_{0}^{N} C_m (TA)^m$$

where AR is a dynamic variable, trim amount (TA) is a required process result, N>=1, and $C_m$ can comprise a constant having at least one of a positive value, a negative value, and a zero value.

Returning to procedure 400, the new recipe may be sent to the processing tool in task 460, and the substrate can be processed using the new recipe. In one embodiment, a trimming procedure can be performed using a processing tool (process chip) that can comprise a COR module, a PHT module, and at least one buffer module. Alternately, a deposition process or an etching process can be performed.

For example, when the required process result (trim amount) for the wafer is in the range (2<=y<=6), the wafer is processed using the first new process recipe; when the required process result (trim amount) for the wafer is in the range 6<y<=17.3), the wafer is processed using the second new process recipe; and when the required process result (trim amount) for the wafer is in the range (17.3<y<=23), the wafer is processed using the third new process recipe.

First, the tool 110 can move a wafer into a first buffer (load lock) module. The first buffer (load lock) module pumps down to vacuum. The tool 110 can move the wafer to a second buffer (PHT) module. The GUI status screens are updated (showing wafer in LL). Next, the tool 110 can move the wafer into a first process (COR) module. The TL controller (FDC component) can select a data collection (DC) strategy defined in a control strategy, and sets up sensors. The status screens can be updated (module state can change). The tool performs a "Recipe Start" for the first process module. The status screens can be updated (module state can change "wafer processing"). Then, the sensors can start recording. The recipe cycles through the processing steps. The first process module can send a "Recipe End" event. The sensors can stop recording; the tool moves wafer to second buffer (PHT) module. Next, the TL controller (FDC component) can collect data file(s) from the tool 110 and start processing the data based on the data collection plan filter. The TL controller (FDC component) can select an analysis strategy defined in the control strategy, process module and process state data, and update database (i.e. module state and process state). Then, the status screens can be updated (module state can show wafer in LL/PHT, a "Recipe Start" for the second buffer (PHT) module, the status screens can be updated (module state can change "wafer processing"). Then, the sensors can start recording. The recipe cycles through the processing steps. The second buffer (PHT) module can send a "Recipe End" event. The sensors can stop recording. The tool 110 moves the wafer to the first buffer (load lock) module. The vacuum state changes from vacuum to atmosphere. The tool 110 moves the wafer out of the first buffer (load lock) module. Then, the status screens are updated. Procedure 400 ends in task 470.

FIG. 21 illustrates an exemplary view of a R2R Formula Model Editor screen in accordance with another embodiment of the invention. In the illustrated embodiment, one formula model "PCMO-Trim-1" is shown. Alternately, different models and/or recipes can be shown.

The Name field comprises "PCMO-Trim-1", which can be the name of a formula model. The Recipe Range field comprises "PCMO-Recipe-Range3", which can be related to a particular process such as a PCMO process, and the Description field can comprise "PCMO trim before COR formula model", which can be a description for the "PCMO-Trim-1" formula model. The Pre-Model Adjustment field comprises the variable (t1). Alternately, a different pre-model adjustment can be used. The "Valid y after adjustment" fields can comprise "22.0" and "30.0", and these can be used to restrict the operating range to 22-30. For example, the pre-model adjust variable (y) value can represent a trim amount measured in nanometers. When the pre-model adjust variable (y) value falls outside of this range, an alarm can occur because this model failed.

The Model Equation field comprises a first order polynomial, but this is not required for the invention. Alternately, other polynomials can be used for the model equation. For example, the model equation dependent variable (y) value can represent a trim amount, and the model equation independent variable (x) value can represent a flow rate for a process gas. The "Valid equation solution x" fields can be used to enter a valid range for the flow rate for a process gas. When the x value falls outside of this range, an alarm can occur because this model failed.

After the process has been completed, post-process metrology data can be obtained. Post-process metrology data can be obtained after a time delay that can vary from minutes to days. Post-process metrology data can be used as a part of the feed-back control. Also, the site measurement data can be summarized as the statistical value for the control wafer according to some business rules. IM data can be pre-metrology data for one control plan and post-metrology data for a different control plan. Also, the post-process metrology data can be filtered. For example, an outlier rejection filter can be used to remove data points on a wafer that are outliers and are statistically invalid. In other words, those sites that are not reliable can be thrown away and not used in the wafer mean calculation.

In one case, a Mean/Sigma compare method can be used on the post-process metrology data. For example, a sigma multiplier can be specified. All data points can be summarized into a mean and a sigma. Two limits can be calculated (Mean+X times sigma and Mean−X times sigma). All data points outside the limits can be removed. The Mean can be recalculated and can represent the final IM measurement. Alternately, outliers can be identified using a box and whisker plot methodology.

In addition, the post-process metrology data can be compared with the pre-process metrology data to determine the actual process result. Measured Target CD is one of the actual process results from a process or process step. Instead of the measured Target CD, usually the measured etched trim amount during a process can be regarded as the actual process result. An offset can be determined that is an estimated amount of process error, that represents the process trend and can be used by the controller to optimize the process model and recipe parameters.

Feed-back control involves using the error signal between the desired output (predicted output) and the measured output to make adjustments to the controller. For example, feed-back can be implemented by adding persistent variables in the system, and these can be used as an offset to the Desired Process result calculation, shifting the set of the process models slowly in time as the system changes. These variables are then updated at the end of the lot based on the post process metrology data for each wafer. The configuration for the feed-back update can be stored in Feed-back Plans within a Control Strategy. For example, after the post metrology is measured in the IMM, the Actual Process Result and the Error Calculation can be performed for each wafer. At the end of the lot, the Error Calculations from each measured wafer are averaged. An update can then be made for each variable defined in the "Control Plan Selections" table of the feedback plan based on the lot average error calculation.

FIGS. 22 and 23 illustrate exemplary views of R2R Control Plan Editor Screens in accordance with other embodiments of the invention. In the illustrated embodiments, R2R Control Plan Editor screens are shown for a control plan for managing a plurality of formula models. Alternately, other processes can be used.

To create/edit a Control Plan, a user can select the plan name item and select a new Control Plan or an existing plan or model. For example, on the Control Strategy Editor screen, a drop-down menu can appear and the Add Plan selection can be chosen.

A Control Plan Editor screen can comprise a number of fields. The Plan Name field can be used to enter/edit a name for the control plan. Module field can be used to enter/edit a module name. For example, if the plan is associated with a strategy, the module field may be automatically filled in. If the plan is unassociated, the module field can be used to select a process module. The Recipe field can be used to enter/edit a recipe. For example, if the plan is associated with a strategy, the recipe field may be automatically filled in. If the plan is unassociated, the field can be used to select a recipe.

The Description field can be used to enter/edit a description for the plan. The Updated field displays the last time the plan was changed.

The Data Sources table can be used to enter/edit a data source. For example, a R2R Plan Data Source screen may be opened. Using the Data Sources table, drop down menus can be used to open a R2R Data Source screen (FIGS. 11A and 11B). A Data Sources screen can be used to: select a symbol for the new data source; select a source type; and select a Data Source Description, among others. For example, the selected source type determines the options displayed on the Data Source screen. A "Telius ODP" type can be used to define integrated metrology module data sources that are part of the processing tool. A "Desired Output" type allows the user to enter a fixed unit for the controller. A "Feed-back Offset" type allows the user to define a persistent feed-back variable. A "Control Plan Value" allows the user to create a variable that references the results of a different control plan (creates nested plans). The "Integrated Metrology Site Filtering" type creates tables with descriptions of each option when each data source is selected.

In the target calculation fields shown in FIGS. 22 and 23, several different target calculations are illustrated and these fields can be changed. For example, an equation (t1) can be entered that relates pre-process data (d1) with desired process result data (o1). Another equation (t2) can be entered that relates pre-process data (d1) with desired process result data (o1) and feed-back offset data (f1) from a feed-back plan. A third equation (t3) can be entered that relates pre-process data (d1) with desired process result data (o2) and feed-back offset data (f2) obtained from another controller, such as a host. In addition, another equation (t4) can be entered that relates post-process data (d2) with desired process result data (o2) obtained from another controller, such as a host; another equation (t5) can be entered that relates post-process data (d2) with desired process result data (o1) and feed-back offset data (f1) from a feed-back plan. One further equation (t6) can be entered that relates post-process data (d2) with desired process result data (o1) and feed-back offset data (f2) obtained from another controller, such as a host. Alternately, the equations can comprise other variables. For example, a compensation factor can be used to correct for errors introduced in another step.

For example, the new target value can be a variable that is calculated at or before run time, and an equation can be used to calculate the target value. In addition, new lower and upper limit values can be used, and these values can be entered in the lower limit field and upper limit field. For example, the new lower and upper limit values can be constants or variables that are calculated at or before run time, and equations can be used to calculate the new lower and upper limit values.

The Model Selections field can be used to create a new model or select an existing Static or Formula model. For example, under the model type selection item, a selection item in the table can be used to enter and/or edit a model type. For example, a drop down list can be activated from the table item and a selection can be made from the drop down list. One option in the drop down list allows a new model to be created. Other options can be used to display and select existing models to use and/or to modify. Each model type can have a module name, target value, lower limit, upper limit, and recipe output associated with it. When creating a new model, a new model type can be used and entered in the model type field, and a new model name can be used and entered in the model name field.

The Predicted Result Calculation field can be used to enter a new predicted result value or select an existing predicted result value. The predicted result value can be an equation for the expected result. For example, a Control Plan can be saved when Name, Target Calculation, and Model Selection information is entered.

Six input data sources are shown with different symbols (d1, d2, f1, f2, o1, and o2), but this is not required. A different number of input data sources can be used, and each input data source can have a different symbol value. In addition, six formula models are shown. The six formula models are shown with different target values (t1-t6), but this is not required. A different number of formula models can be used, and each formula model can have a different target value. The six formula models can have different operating ranges as defined by the lower limit values and the upper limit values.

FIG. 24 illustrates an exemplary view of a R2R Feed-back Plan Editor screen in accordance with another embodiment of the invention. In the illustrated embodiment, feed-back calculation fields are shown for a feed-back formula model. Alternately, other processes can be used.

To create/edit a Feed-back Plan, a user can select the plan name item and select a new Feed-back Plan or an existing plan or model. For example, on the Control Strategy Editor screen, a drop-down menu can appear and the Add Plan selection can be chosen.

A R2R Feed-back Plan Editor screen can comprise a number of fields. The Plan Name field can be used to enter/edit a name for the feed-back plan. The Description field can be used to enter/edit a description for the plan. The Updated field displays the last time the plan was changed.

The Data Sources table can be used to enter/edit a data source. For example, a R2R Plan Data Source screen may be opened. Using the Data Sources table, drop down menus can be used to open a R2R Data Source screen (FIGS. 11A and 11B). A Data Sources screen can be used to: select a symbol for the new data source, select a source type, and select a Data Source Description, among others. For example, the selected source type determines the options displayed on the Data Source screen. A "Telius ODP" type can be used to define integrated metrology module data sources that are part of the processing tool. A "Desired Output" type allows the user to enter a fixed unit for the controller. A "Feed-back Offset" type allows the user to define a persistent feedback variable. A "Control Plan Value" allows the user to create a variable that references the results of a different control plan (creates nested plans). The "Integrated Metrology Site Filtering" type creates tables with descriptions of each option when each data source is selected.

In the Actual Process Result Calculation field, an equation can be entered, and the equation can be used to determine an "Actual Process Result. "Actual Process Results" can include at least one of measured data, predicted data, simulated data, and actual data. As shown in FIG. 24, the "Actual Process Result" can be a predicted value. Alternately, different values can be used, and several different variables can be used. For example, an equation (a1) can be entered that uses pre-process data, desired process result data, post-process data, and data obtained from another controller, such as a host.

For example, the actual process result value can be a variable that is calculated after a process has run, and an equation can be used to calculate the actual process result value. In addition, lower and upper limit values can be used, and these values can be entered in the lower limit field (not shown) and upper limit field (not shown). For example, the new lower and upper limit values can be constants or variables that are calculated at or before run time, and equations can be used to calculate the new lower and upper limit values.

The Error Calculation field can be used to enter a new calculated error value or edit an existing error calculation equation. For example, the calculated error value can be a variable that is calculated after a process has run, and an equation can be used to determine the calculated error value. In addition, lower and upper limit values can be used, and these values can be entered in the lower limit field (not shown) and upper limit field (not shown). For example, the new lower and upper limit values can be constants or variables that are calculated at or before run time, and equations can be used to calculate the new lower and upper limit values.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A method of processing a substrate comprising:
    receiving pre-process data, the pre-process data comprising a desired process result and actual measured data for the substrate;
    determining a required process result, the required process result comprising the difference between the desired process result and the actual measured data;
    creating a new process recipe by modifying a nominal recipe obtained from a processing tool using at least one of a static recipe and a formula model, wherein:
    the new process recipe provides a new process result that is approximately equal to the required process result,
    the nominal recipe comprises a plurality of process steps, each step having a plurality of process parameters defined therein,
    the static recipe comprises at least one constant value for further defining at least one of the process parameters in at least one of the process steps, and the formula model comprises at least one dynamic variable for further defining at least one of the process parameters in at least one of the process steps;
sending the new process recipe to the processing tool;
processing the substrate based on the new process recipe;
creating the formula model using an $N^{th}$ order equation of the form $$y = \sum_0^N A_n x^n,$$

where x comprises a dynamic variable, y is the required process result, $N>=1$, $A_n$ comprises a constant having at least one of a positive value, a negative value, and a zero value, and n is a whole number greater than or equal to zero;
solving the $N^{th}$ order equation to determine a value for the dynamic variable;
modifying the nominal recipe by including the determined value in at least one of the process steps;
creating a first formula model component using a first $N^{th}$ order equation of the form $$y(1) = \sum_0^N A(1)_n x(1)^n,$$

wherein the first formula model component is used in a first processing regime, wherein x(1) comprises a dynamic variable in the first processing regime, y is the required process result in the first processing regime, $N>=1$, $A(1)_n$ comprises a constant having at least one of a positive value, a negative value, and a zero value, and n is a whole number greater than or equal to zero;
creating a second formula model component using a second $N^{th}$ order equation of the form $$y(2) = \sum_0^N A(2)_n x(2)^n,$$

wherein the second formula model component is used in a second processing regime, wherein x(2) comprises a dynamic variable in the second processing regime, y is the required process result in the second processing regime, $N>=1$, $A(2)_n$ comprises a constant having at least one of a positive value, a negative value, and a zero value, and n is a whole number greater than or equal to zero;
solving the first $N^{th}$ order equation to determine a value for the dynamic variable in the first processing regime;
modifying the nominal recipe by including the determined value for the dynamic variable in the first processing regime in at least one of the process steps;
solving the second $N^{th}$ order equation to determine a value for the dynamic variable in the second processing regime; and
modifying the nominal recipe by including the determined value for the dynamic variable in the second processing regime in at least one of the process steps.

2. The method of processing a substrate of claim 1, further comprising:

creating the formula model using an $N^{th}$ order equation of the form $$x = \sum_0^N C_m y^m,$$

where x comprises a dynamic variable, y is the required process result, $N>=1$, $C_m$ comprises a constant having at least one of a positive value, a negative value, and a zero value, and m is a whole number greater than or equal to zero;
solving the $N^{th}$ order equation to determine a value for the dynamic variable; and
modifying the nominal recipe by including the determined value in at least one of the process steps.

3. The method of processing a substrate of claim 1, wherein a first control parameter is used to establish the processing regimes, wherein the first process regime is determined using a first value for the first control parameter, and the second processing regime is determined using a second value for the first control parameter.

4. The method of processing a substrate of claim 3, wherein the first control parameter is chamber pressure, the first processing regime being determined when chamber pressure is less the 12 mTorr and the second processing regime being determined when chamber pressure is greater than or equal to 12 mTorr.

5. The method of processing a substrate of claim 1, further comprising:

creating a third formula model component using a third $N^{th}$ order equation of the form $$y(3) = \sum_0^N A(3)_n x(3)^n,$$

wherein the third formula model component is used in a third processing regime, wherein x(3) comprises a dynamic variable in the third processing regime, y is the required process result in the third processing regime, $N>=1$, $A(3)_n$ comprises a constant having at least one of a positive value, a negative value, and a zero value, and n is a whole number greater than or equal to zero;
solving the third $N^{th}$ order equation to determine a value for the dynamic variable in the third processing regime; and
modifying the nominal recipe by including the determined value for the dynamic variable in the third processing regime in at least one of the process steps.

6. The method of processing a substrate of claim 1, wherein the desired process result comprises at least one of a target critical dimension (CD), a target CD profile, a CD uniformity value, and a CD profile uniformity value.

7. The method of processing a substrate of claim 1, wherein the pre-process data comprises at least one of a measured critical dimension (CD), a measured CD profile, a measured CD uniformity value, and a measured CD profile uniformity value.

8. The method of processing a substrate of claim 1, wherein the pre-process data comprises data received from at least one of a user, a tool level controller, a system level controller, and a factory level controller.

9. The method of processing a substrate of claim 1, further comprising:
    determining when the nominal recipe can be used by comparing a nominal process result with the required process result; and
    refraining from sending a new process recipe to the processing tool when the nominal process result is approximately equal to the required process result;
    processing the substrate based on the nominal recipe.

10. The method of processing a substrate of claim 1, wherein the new process recipe comprises a Chemical Oxide Removal (COR) process, the required process result comprises a trim amount, and the dynamic variable comprises a flow rate for a process gas.

11. The method of processing a substrate of claim 10, wherein the new process recipe comprises a COR process recipe and a Post Heat Treatment (PHT) process recipe, the method further comprising:
    executing a COR process recipe in a COR module, wherein exposed surfaces on a substrate are chemically treated using the process gas, wherein a solid reaction product is formed on at least one exposed surface; and
    executing a PHT process recipe in a PHT module, wherein the executing comprises evaporating the solid reaction product, thereby trimming the chemically treated exposed surface layers.

12. The method of processing a substrate of claim 11, further comprising:
    repeating the executing steps until the required process result is achieved.

13. The method of processing a substrate of claim 10, further comprising:
    executing a COR process recipe in a COR module, wherein exposed surfaces on a substrate are chemically treated using the process gas, wherein a solid reaction product having a thickness approximately equal to the trimming amount is formed on at least one exposed surface; and
    executing a Post Heat Treatment (PHT) process recipe in a PHT module, wherein the executing comprises evaporating the solid reaction product, thereby trimming at least one of the chemically treated exposed surfaces by the trim amount.

14. The method of processing a substrate of claim 13, wherein the executing a COR process recipe comprises:
    transferring the substrate into the COR module that comprises a chemical treatment chamber;
    positioning the substrate on a temperature controlled substrate holder mounted within the chemical treatment chamber;
    altering the chamber pressure using a vacuum pumping system coupled to the chemical treatment chamber;
    providing the process gas using a gas distribution system coupled to the chemical treatment chamber and configured to introduce a process gas into the chemical treatment chamber; and
    controlling the COR module, the temperature controlled substrate holder, the vacuum pumping system, and the gas distribution system according to the process recipe.

15. The method of processing a substrate of claim 13, wherein the executing a PHT process recipe comprises:
    transferring the substrate into a PHT module that comprises a thermal treatment chamber;
    positioning the substrate on a temperature controlled substrate holder mounted within the thermal treatment chamber;
    altering the chamber temperature using a temperature controlled upper assembly coupled to the thermal treatment chamber;
    altering the chamber pressure using a vacuum pumping system coupled to the thermal treatment chamber; and
    controlling the PHT module, the vacuum pumping system, temperature control system, and the temperature controlled substrate holder according to the process recipe.

16. The method of processing a substrate of claim 1, further comprising:
    receiving post-process metrology data; and
    using the post-process metrology data to update at least one of the nominal recipe, the static recipe, and the formula model.

17. A method of processing a substrate comprising:
    receiving pre-process data, the pre-process data comprising a desired process result and actual measured data for the substrate;
    determining a required process result, the required process result comprising the difference between the desired process result and the actual measured data;
    creating a new process recipe by modifying a nominal recipe obtained from a processing tool using at least one of a static recipe and a formula model, wherein:
        the new process recipe provides a new process result that is approximately equal to the required process result,
        the nominal recipe comprises a plurality of process steps, each step having a plurality of process parameters defined therein,
        the static recipe comprises at least one constant value for further defining at least one of the process parameters in at least one of the process steps, and
        the formula model comprises at least one dynamic variable for further defining at least one of the process parameters in at least one of the process steps;
    sending the new process recipe to the processing tool;
    processing the substrate based on the new process recipe;
    creating the formula model using an $N^{th}$ order equation of the form $$y = \sum_0^N A_n x^n,$$

where x comprises a dynamic variable, y is the required process result, $N \geq 1$, $A_n$ comprises a constant having at least one of a positive value, a negative value, and a zero value, and n is a whole number greater than or equal to zero;
    solving the $N^{th}$ order equation to determine a value for the dynamic variable; and
    modifying the nominal recipe by including the determined value in at least one of the process steps;
    creating a first formula model component using a first $N^{th}$ order equation of the form $$x(1) = \sum_0^N C(1)_n y(1)^n,$$

wherein the first formula model component is used in a first processing regime, wherein x(1) comprises a dynamic variable in the first processing regime, y is the required process result in the first processing regime, N>=1, $C(1)_n$ comprises a constant having at least one of a positive value, a negative value, and a zero value, and n is a whole number greater than or equal to zero;

creating a second formula model component using a second $N^{th}$ order equation of the form $$x(2) = \sum_0^N C(2)_n y(2)^n,$$

wherein the second formula model component is used in a second processing regime, wherein x(2) comprises a dynamic variable in the second processing regime, y is the required process result in the second processing regime, N>=1, $C(2)_n$ comprises a constant having at least one of a positive value, a negative value, and a zero value, and n is a whole number greater than or equal to zero;

solving the first $N^{th}$ order equation to determine a value for the dynamic variable in the first processing regime;

modifying the nominal recipe by including the determined value for the dynamic variable in the first processing regime in at least one of the process steps;

solving the second $N^{th}$ order equation to determine a value for the dynamic variable in the second processing regime; and modifying the nominal recipe by including the determined value for the dynamic variable in the second processing regime in at least one of the process steps.

18. The method of processing a substrate of claim 17, further comprising:

creating a third formula model component using a third $N^{th}$ order equation of the form $$x(3) = \sum_0^N C(3)_n y(3)^n,$$

wherein the third formula model component is used in a third processing regime, wherein x(3) comprises a dynamic variable in the third processing regime, y is the required process result in the third processing regime, N>=1, $C(3)_n$ comprises a constant having at least one of a positive value, a negative value, and a zero value, and n is a whole number greater than or equal to zero;

solving the third $N^{th}$ order equation to determine a value for the dynamic variable in the third processing regime; and modifying the nominal recipe by including the determined value for the dynamic variable in the third processing regime in at least one of the process steps.

19. A method of processing a substrate comprising:

receiving pre-process data, wherein the pre-process data comprises a desired process result and actual measured data for the substrate;

determining a required process result, wherein the required process result comprises the difference between the desired process result and the actual measured data;

creating a new process recipe by modifying a nominal recipe obtained from a processing tool using at least one of a static recipe and a formula model, wherein the new process recipe provides a new process result that is approximately equal to the required process result, the nominal recipe comprises a first table having a first number of columns and a second number of rows, each column comprising a process step and each row comprising a process parameter, each cell comprising a process parameter value, a static recipe comprising a second table having the first number of columns and the second number of rows, at least one cell of the second table comprising a constant value for modifying a process parameter value associated with at least one cell in the first table, and a formula model comprising a third table having the first number of columns and the second number of rows, at least one cell of the third table comprising a dynamic variable for modifying a process parameter value associated with the at least one cell of the first table;

sending the new process recipe to the processing tool and processing the substrate based on the new process recipe;

creating the formula model using an $N^{th}$ order equation of the form $$y = \sum_0^N A_n x^n,$$

where x comprises a dynamic variable, y is the required process result, N>=1, $A_n$ comprises a constant having at least one of a positive value, a negative value, and a zero value, and n is a whole number greater than or equal to zero;

solving the $N^{th}$ order equation to determine a value for the dynamic variable; and modifying the nominal recipe by including the determined value in at least one of the process steps;

creating a first formula model component using a first $N^{th}$ order equation of the form $$y(1) = \sum_0^N A(1)_n x(1)^n,$$

wherein the first formula model component is used in a first processing regime, wherein x(1) comprises a dynamic variable in the first processing regime, y is the required process result in the first processing regime, N>=1, $A(1)_n$ comprises a constant having at least one of a positive value, a negative value, and a zero value, and n is a whole number greater than or equal to zero;

creating a second formula model component using a second $N^{th}$ order equation of the form $$y(2) = \sum_0^N A(2)_n x(2)^n,$$

wherein the second formula model component is used in a second processing regime, wherein x(2) comprises a dynamic variable in the second processing regime, y is the required process result in the second processing regime, N>=1, $A(2)_n$ comprises a constant having at least one of a positive value, a negative value, and a zero value, and n is a whole number greater than or equal to zero;

solving the first $N^{th}$ order equation to determine a value for the dynamic variable in the first processing regime;

modifying the nominal recipe by including the determined value for the dynamic variable in the first processing regime in at least one of the process steps;

solving the second $N^{th}$ order equation to determine a value for the dynamic variable in the second processing regime; and modifying the nominal recipe by including the determined value for the dynamic variable in the second processing regime in at least one of the process steps.

20. The method of processing a substrate of claim 19, further comprising:

creating the formula model using an $N^{th}$ order equation of the form $$x = \sum_{0}^{N} C_m y^m,$$

where x comprises a dynamic variable, y is the required process result, N>=1, $C_m$ comprises a constant having at least one of a positive value, a negative value, and a zero value, and m is a whole number greater than or equal to zero;

solving the $N^{th}$ order equation to determine a value for the dynamic variable; and modifying the nominal recipe by including the determined value in at least one of the process steps.

21. The method of processing a substrate of claim 19, wherein a first control parameter is used to establish the processing regimes, wherein the first process regime is determined using a first value for the first control parameter, and the second processing regime is determined using a second value for the first control parameter.

22. The method of processing a substrate of claim 21, wherein the first control parameter is chamber pressure, the first processing regime being determined when chamber pressure is less the 12 mTorr and the second processing regime being determined when chamber pressure is greater than or equal to 12 mTorr.

23. The method of processing a substrate of claim 19, further comprising:

creating a third formula model component using a third $N^{th}$ order equation of the form $$y(3) = \sum_{0}^{N} A(3)_n x(3)^n,$$

wherein the third formula model component is used in a third processing regime, wherein x(3) comprises a dynamic variable in the third processing regime, y is the required process result in the third processing regime, N>=1, $A(3)_n$ comprises a constant having at least one of a positive value, a negative value, and a zero value, and n is a whole number greater than or equal to zero;

solving the third $N^{th}$ order equation to determine a value for the dynamic variable in the third processing regime; and modifying the nominal recipe by including the determined value for the dynamic variable in the third processing regime in at least one of the process steps.

24. The method of processing a substrate of claim 19, further comprising:

receiving post-process metrology data; and using the post-process metrology data to update at least one of the nominal recipe, the static recipe, and the formula model.

25. The method of processing a substrate of claim 19, wherein the formula model comprises a pre-model adjustment equation, a model equation, a plurality of post model adjustments, and a recipe parameter assignment map.

26. A method of processing a substrate comprising:

receiving pre-process data, wherein the pre-process data comprises a desired process result and actual measured data for the substrate;

determining a required process result, wherein the required process result comprises the difference between the desired process result and the actual measured data;

creating a new process recipe by modifying a nominal recipe obtained from a processing tool using at least one of a static recipe and a formula model, wherein the new process recipe provides a new process result that is approximately equal to the required process result, the nominal recipe comprises a first table having a first number of columns and a second number of rows, each column comprising a process step and each row comprising a process parameter, each cell comprising a process parameter value, a static recipe comprising a second table having the first number of columns and the second number of rows, at least one cell of the second table comprising a constant value for modifying a process parameter value associated with at least one cell in the first table, and a formula model comprising a third table having the first number of columns and the second number of rows, at least one cell of the third table comprising a dynamic variable for modifying a process parameter value associated with the at least one cell of the first table;

sending the new process recipe to the processing tool and processing the substrate based on the new process recipe;

creating the formula model using an $N^{th}$ order equation of the form $$y = \sum_{0}^{N} A_n x^n,$$

where x comprises a dynamic variable, y is the required process result, N>=1, $A_n$ comprises a constant having at least one of a positive value, a negative value, and a zero value, and n is a whole number greater than or equal to zero;

solving the $N^{th}$ order equation to determine a value for the dynamic variable; and modifying the nominal recipe by including the determined value in at least one of the process steps;

creating a first formula model component using a first $N^{th}$ order equation of the form $$x(1) = \sum_0^N C(1)_n y(1)^n,$$

wherein the first formula model component is used in a first processing regime, wherein x(1) comprises a dynamic variable in the first processing regime, y is the required process result in the first processing regime, $N \geq 1$, $C(1)_n$ comprises a constant having at least one of a positive value, a negative value, and a zero value, and n is a whole number greater than or equal to zero;

creating a second formula model component using a second $N^{th}$ order equation of the form $$x(2) = \sum_0^N C(2)_n y(2)^n,$$

wherein the second formula model component is used in a second processing regime, wherein x(2) comprises a dynamic variable in the second processing regime, y is the required process result in the second processing regime, N>=1, $C(2)_n$ comprises a constant having at least one of a positive value, a negative value, and a zero value, and n is a whole number greater than or equal to zero;

solving the first $N^{th}$ order equation to determine a value for the dynamic variable in the first processing regime;

modifying the nominal recipe by including the determined value for the dynamic variable in the first processing regime in at least one of the process steps;

solving the second $N^{th}$ order equation to determine a value for the dynamic variable in the second processing regime; and modifying the nominal recipe by including the determined value for the dynamic variable in the second processing regime in at least one of the process steps.

27. The method of processing a substrate of claim 26, further comprising:

creating a third formula model component using a third $N^{th}$ order equation of the form $$x(3) = \sum_0^N C(3)_n y(3)^n,$$

wherein the third formula model component is used in a third processing regime, wherein x(3) comprises a dynamic variable in the third processing regime, y is the required process result in the third processing regime, N>=1, $C(3)_n$ comprises a constant having at least one of a positive value, a negative value, and a zero value, and n is a whole number greater than or equal to zero;

solving the third $N^{th}$ order equation to determine a value for the dynamic variable in the third processing regime; and modifying the nominal recipe by including the determined value for the dynamic variable in the third processing regime in at least one of the process steps.

* * * * *